US012785710B2

(12) United States Patent
Lee et al.

(10) Patent No.: US 12,785,710 B2
(45) Date of Patent: Nov. 3, 2026

(54) ANALOG-TO-DIGITAL CONVERTER

(71) Applicant: Seoul National University R&DB FOUNDATION, Seoul (KR)

(72) Inventors: Jong-Ho Lee, Seoul (KR); Jiseong Im, Seoul (KR); Jonghyun Ko, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 139 days.

(21) Appl. No.: 18/999,136

(22) Filed: Dec. 23, 2024

(65) Prior Publication Data

US 2025/0240026 A1 Jul. 24, 2025

Related U.S. Application Data

(60) Provisional application No. 63/623,798, filed on Jan. 22, 2024.

(51) Int. Cl.
*H03M 1/12* (2006.01)

(52) U.S. Cl.
CPC .................................. *H03M 1/123* (2013.01)

(58) Field of Classification Search
CPC ........ H03M 1/123; H03M 1/361; H03M 1/34; H03M 1/235
USPC ........................................ 341/172, 155, 159
See application file for complete search history.

(56) References Cited

U.S. PATENT DOCUMENTS 7,965,218 B2 6/2011 Ohnhaeuser et al.
2008/0245864 A1* 10/2008 Hayashi ................. G06F 21/74 235/435
2009/0091483 A1 4/2009 Venkataraman et al.
2014/0052404 A1* 2/2014 Gauvin ............ G01R 31/31708 702/120

FOREIGN PATENT DOCUMENTS

KR 20100027278 A 3/2010

* cited by examiner

*Primary Examiner* — Peguy Jean Pierre
(74) *Attorney, Agent, or Firm* — CANTOR COLBURN LLP

(57) ABSTRACT

Provided is an analog-to-digital converter. The ADC includes a plurality of bit detection units. Each of the bit detection unit comprises: a state level determination module including a semiconductor device with a preset threshold voltage to receive an input signal; and an output module connected to the state level determination module and configured to detect and output a binary value corresponding to the input voltage. The bit detection units are configured to match one-to-one with the bits constituting a digital code, respectively. The state level determination module is configured to have a threshold voltage or conductance determined according to the bit of the digital code matched to the bit detection unit. Each of the bit detection units detects and outputs a binary value corresponding to the matched bit of the digital code from the input signal.

17 Claims, 19 Drawing Sheets

FIG. 6A

Turned on    Turned off

| $V_{in}$ | 0.15 V | 0.37 V | 0.63 V |
|---|---|---|---|
| $V_{th1}$ (0.1 V) | On | On | On |
| $V_{th2}$ (0.2 V) | Off | On | On |
| $V_{th3}$ (0.3 V) | Off | On | On |
| $V_{th4}$ (0.4 V) | Off | Off | On |
| $V_{th5}$ (0.5 V) | Off | Off | On |
| $V_{th6}$ (0.6 V) | Off | Off | On |
| $V_{th7}$ (0.7 V) | Off | Off | Off |

Thermometer Code

FIG. 6B

| $V_{IN}$ | Thermometer Code |
|---|---|
| 0.15V | 1000000 |
| 0.37V | 1110000 |
| 0.63V | 1111110 |

ANALOG-TO-DIGITAL CONVERTER

TECHNICAL FIELD

The present invention relates to an analog-to-digital converter. More specifically, the present invention relates to the analog-to-digital converter implemented by an arrangement of semiconductor devices with different threshold voltages or conductances. With such a configuration, the analog-to-digital converter according to the present invention can be accomplished in a small area, operate with low power consumption, and enhance performance in various applications, including neuromorphic systems.

BACKGROUND ART

An analog-to-digital converter ("ADC") is an electronic device that converts the analog signal into the digital signal. In the natural world, signals such as temperature, voltage, etc. detected by sensors are analog signals. The ADC circuit converts these analog signals into digital signals that can be processed by electronic devices such as computers, control devices, and so on. In recent years, as the advanced electronic devices such as IoT, neuromorphic systems, etc. have been widely commercialized, the demand for ADCs with low power consumption and compact size has significantly been increasing. In response to this need. ADCs with various structures are being developed.

U.S. Patent Publication No. 2009-0091483 discloses a Flash ADC structure, which is one of the ADC types. FIG. 1 is a structural diagram illustrating the Flash ADC Scheme. As shown in FIG. 1, the Flash ADC performs an ADC operation of converting an analog signal into a digital signal using a comparator bank consisting of $2^n$ comparators. The comparators of the flash ADC are input with a reference voltage corresponding to a reference value and the analog voltage to be determined. The comparators in the Flash ADC then compare the magnitudes of the two input signals and output the result as a digital code. The Flash ADC with this structure continue to be widely used in applications that require high speed and low latency.

However, the conventional Flash ADC with the aforementioned structure use a large number of comparators, resulting in high power consumption during operation. Therefore, conventional Flash ADC is difficult to use in low-power applications. In addition, conventional Flash ADC requires a large chip area due to accommodation for the large number of comparators used. This makes it difficult for ADCs with the above structure to be used in compact applications.

In addition, the resolution of the conventional Flash ADC is limited by the number of comparators used. Therefore, in order to increase the resolution of the Flash ADC, the number of comparators must be increased, which complicates the circuit structure of the ADC, increases manufacturing costs, and increases power consumption. Therefore, the conventional Flash ADC with the aforementioned structure experiences exponential increases in device area and power consumption as the number of bits increases. Consequently, the ADC with the aforementioned structure is difficult to use in applications requiring high resolution.

U.S. Pat. No. 7,965,218 discloses a Successive Approximation Register (SAR) ADC structure. FIG. 2 is a structural diagram illustrating the SAR ADC scheme. As shown in FIG. 2, the SAR ADC performs the ADC operation by utilizing a single comparator, a Digital-to-Analog Converter (DAC), logic circuits, a register, etc. Generally, it determines each bit sequentially, starting from the Most Significant Bit (MSB). The SAR ADC employs a single comparator, and the DAC uses multiple capacitors of varying sizes. The DAC output is controlled using the charge sharing principle. The register stores the bit determination results up to now. The DAC adjusts the reference voltage of the comparator through the logic circuit according to the bit determination results stored in the register. By repeating the above-described process, the SAR ADC determines the bit values from the Most Significant Bit (MSB) to the Least Significant Bit (LSB).

Although the SAR ADC with the above-described structure provides high resolution, it still suffers from the issues of occupying a large circuit area and consuming a lot of power.

SUMMARY OF THE INVENTION

In order to solve the above-mentioned problems, the present invention aims to provide an ADC that significantly reduces the circuit area and power consumption, making it suitable for use in various systems including neuromorphic networks. The ADC according to the present invention is characterized in that it is configured to perform the ADC operation by using an array structure composed of memory devices with different threshold voltages.

In the first aspect of the present invention, an analog-to-digital converter for converting an input analog signal into a digital code consisting of N bits (where N is a natural number) with binary values and outputting the digital code, may include: a plurality of bit detection units sequentially arranged with each other and configured to output binary values of a digital code corresponding to one or more input signals, wherein each of the bit detection units comprises: one or more state level determination modules composed of semiconductor device with predetermined threshold voltage or conductance and configured to receive the one or more input signals; and an output module connected to the state level determination modules and configured to receive a voltage determined by the state level determination modules and output a binary value corresponding to the received voltage, wherein the bit detection units are configured to match one-to-one with the bits of the digital code, respectively, and wherein the state level determination module of the bit detection unit has threshold voltage or conductance determined according to the matched bit of the digital code.

In the analog-to-digital converter according to the first aspect of the present invention, it is preferable that the state level determination module of the bit detection unit may include a semiconductor device having a non-volatile memory characteristic capable of varying a threshold voltage or conductance.

In the analog-to-digital converter according to the first aspect of the present invention, it is preferable that each of the bit detection units may further include a threshold voltage adjustment module configured to adjust the threshold voltage or conductance of the state level determination module.

In the analog-to-digital converter according to the first aspect of the present invention, it is preferable that the state level determination module of the bit detection unit may include one of a flash memory device, a resistive random-access memory (ReRAM) device, a phase-change memory (PCM) device, a ferroelectric memory device, a magnetic random access memory (MRAM) device, and a field-effect transistor (FET) device.

In the analog-to-digital converter according to the first aspect of the present invention, it is preferable that the state level determination module of the bit detection unit may include a flash memory device or a field-effect transistor (FET) device with a gate electrode, and the device is configured to have a predetermined threshold voltage or conductance by adjusting a coupling ratio between the gate electrode and peripheral electrodes.

In the analog-to-digital converter according to the first aspect of the present invention, it is preferable that the output module of the bit detection unit may be configured to generate and output a binary value corresponding to the input voltage of the output module based on a predetermined switching voltage, and comprises one of an inverter circuit, a buffer circuit, a sense amplifier, and a flip-flop circuit.

In the analog-to-digital converter according to the first aspect of the present invention, it is preferable that the output module may be configured to determine an amount of charge charged in an input capacitance of the output module according to the state of the state level determination module, determine an input voltage of the output module according to the amount of charge, and detect and output a binary value corresponding to the input voltage of the output module.

In the analog-to-digital converter according to the first aspect of the present invention, it is preferable that the bit detection unit may further include a switching module being connected to the state level determination module, and the switching module is configured to control the current flow through the state level determination module so as to charge or discharge the input capacitance of the output module connected to the state level determination module.

In the analog-to-digital converter according to the first aspect of the present invention, it is preferable that the bit detection unit may further include an operation speed adjustment capacitor disposed between the input terminal and the ground terminal of the output module, and the operation speed adjustment capacitor is configured to increase the input capacitance of the output module, thereby adjusting the charging or discharging speed of the input capacitance and controlling the operation speed of the bit detection unit.

In the analog-to-digital converter according to the first aspect of the present invention, it is preferable that the output module may be configured to determine the input voltage of the output module based on the difference between the threshold voltage of the state level determination module and the input signal applied to the state level determination module, and detect and output a binary value corresponding to the input voltage of the output module.

In the analog-to-digital converter according to the first aspect of the present invention, it is preferable that the bit detection unit may further include a reference current source connected to the state level determination module and be configured to provide a reference current to the state level determination module, and the reference current may be a reference current for comparison when the state level determination module is turned on.

In the analog-to-digital converter according to the first aspect of the present invention, it is preferable that the reference current source of the bit detection unit is composed of a flash memory device or a field-effect transistor (FET) device, the bit detection units may be each configured to have different reference current values, and the flash memory device or FET device constituting the reference current source may be configured to have the channel width determined according to the reference current value.

In the analog-to-digital converter according to the first aspect of the present invention, it is preferable that two or more state level determination modules provided in a single bit detection unit may be connected in parallel with each other.

In the analog-to-digital converter according to the first aspect of the present invention, it is preferable that two or more state level determination modules provided in a single bit detection unit may have the same threshold voltage or conductance and may be configured to receive respective input signals, the state level determination modules provided in different bit detection units may have different threshold voltages or conductances, and the plurality of bit detection units may output binary values constituting a digital code.

In the analog-to-digital converter according to the first aspect of the present invention, it is preferable that a single bit detection unit may include multiple state level determination modules, and the multiple state level determination modules within the single bit detection unit may be configured to have the same threshold voltage by being fabricated with a size larger than the process minimum size or by applying a common centroid layout technique such that the multiple state level determination modules share a single center, thereby reducing dispersion caused by the positions of the state level determination modules.

In the analog-to-digital converter according to the first aspect of the present invention, it is preferable that the ADC may further include a signal input unit configured to provide one or more input signals to one or more state level determination modules of the bit detection units, respectively, wherein the signal input unit sequentially may provide the input signals to the one or more state level determination modules of the bit detection units, and the analog-to-digital converter sequentially may output digital codes corresponding to the one or more input signals.

In the analog-to-digital converter according to the first aspect of the present invention, it is preferable that the ADC may further include a signal input unit which provides one or more input signals to one or more state level determination modules of the bit detection units, respectively, wherein the signal input unit may simultaneously provide the input signals to the state level determination modules of the bit detection units, respectively, and the analog-to-digital converter may output a digital code corresponding to a value obtained by pooling the input signals.

The ADC according to the present invention with the aforementioned technical configuration can be implemented using an array structure of memory devices with different threshold voltages to obtain a thermometer code for the input signal. In particular, the ADC according to the present invention can be implemented using an AND array architecture or a NOR array architecture. Furthermore, the thermometer code can be converted into a binary code by applying conventional methods.

Additionally, the ADC according to the present invention can be implemented using an array structure of memory devices, thereby significantly increasing the integration density compared to conventional ADCs and operating with extremely low power consumption.

Furthermore, the ADC according to the present invention can achieve linear and nonlinear outputs by adjusting the interval between threshold voltages of the adjacent state level determination modules. Through this, various types of activation functions used in neural networks can be implemented.

In addition, the ADC according to the present invention can perform pooling operations on multiple signals very effectively by configuring it to be able to apply multiple input signals simultaneously.

In addition, the ADC according to the present invention can be utilized not only in conventional systems but also in various neuromorphic systems or neural networks.

In addition, the ADC according to the present invention can be implemented using various types of memory devices such as flash memory devices, resistive random-access memory (RRAM) devices, phase change memory (PCM) devices, ferroelectric memory devices, magnetoresistive memory devices, etc. as the state level determination module. Additionally, the ADC according to the present invention can improve the performance of the ADC through a pulse structure applied to the input voltage or the circuit configuration of the output module.

In addition, the ADC according to the present invention can control the operation speed by additionally connecting capacitors, and can improve the operation speed, etc. according to the characteristics of the devices used in the corresponding structure.

In addition, the ADC according to the present invention can improve the performance by changing the number or structure of the inverters constituting the output module. Furthermore, the ADC of the present invention can implement more precise operation by replacing the inverters with circuits such as buffers or sense amplifiers.

BRIEF DESCRIPTION OF THE DRAWINGS

FIGS. 6A and 6B are diagrams exemplarily representing the states of the state level determination modules of each bit detection unit for various input signals in the analog-to-digital converter according to the first embodiment of the present invention.

DETAILED DESCRIPTION

The analog-to-digital converter according to the present invention is characterized in converting an analog input signal into a digital code composed of N bits (where N is a natural number) with a binary value by using a memory array structure in which the memory devices with different threshold voltages are sequentially arranged and outputting the converted digital code. The digital code obtained by the ADC according to the present invention may be in the form of a thermometer code. Meanwhile, if it is necessary to convert the thermometer code into a binary code, it can be accomplished through an additional circuit module such as a thermometer-to-binary encoder.

Hereinafter, the structure and operation of the ADC according to preferred embodiments of the present invention will be described in detail with reference to the accompanying drawings.

First Embodiment

Hereinafter, the structure and operation of the ADC according to the first embodiment of the present invention will be specifically described with reference to the accompanying drawings. The ADC according to the first embodiment of the present invention is characterized in that it is implemented by arranging sequentially multiple state level determination modules with different threshold voltages corresponding to bit positions in the array structure, and utilizing the characteristics that each of the state level determination modules, which are turned on or off according to the input signal, discharge the input capacitances of the output modules.

Figure 1:
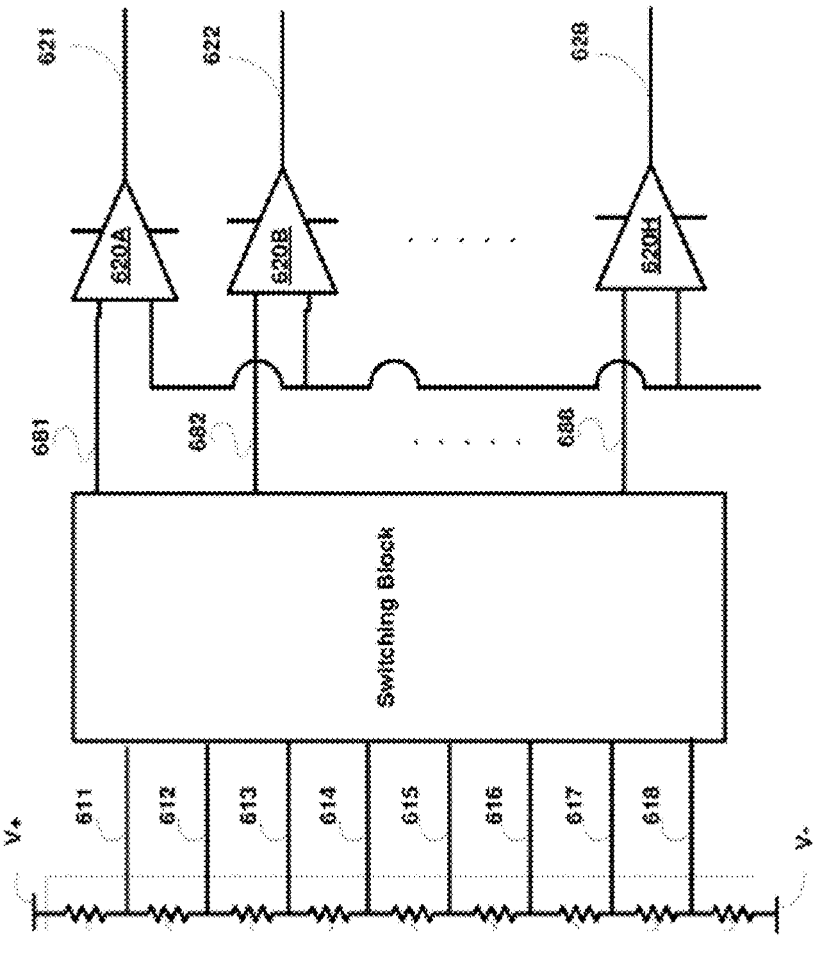
FIG. 1 Prior Art
FIG. 1 is a structural diagram illustrating a Flash ADC Scheme according to prior art.
Figure 2:
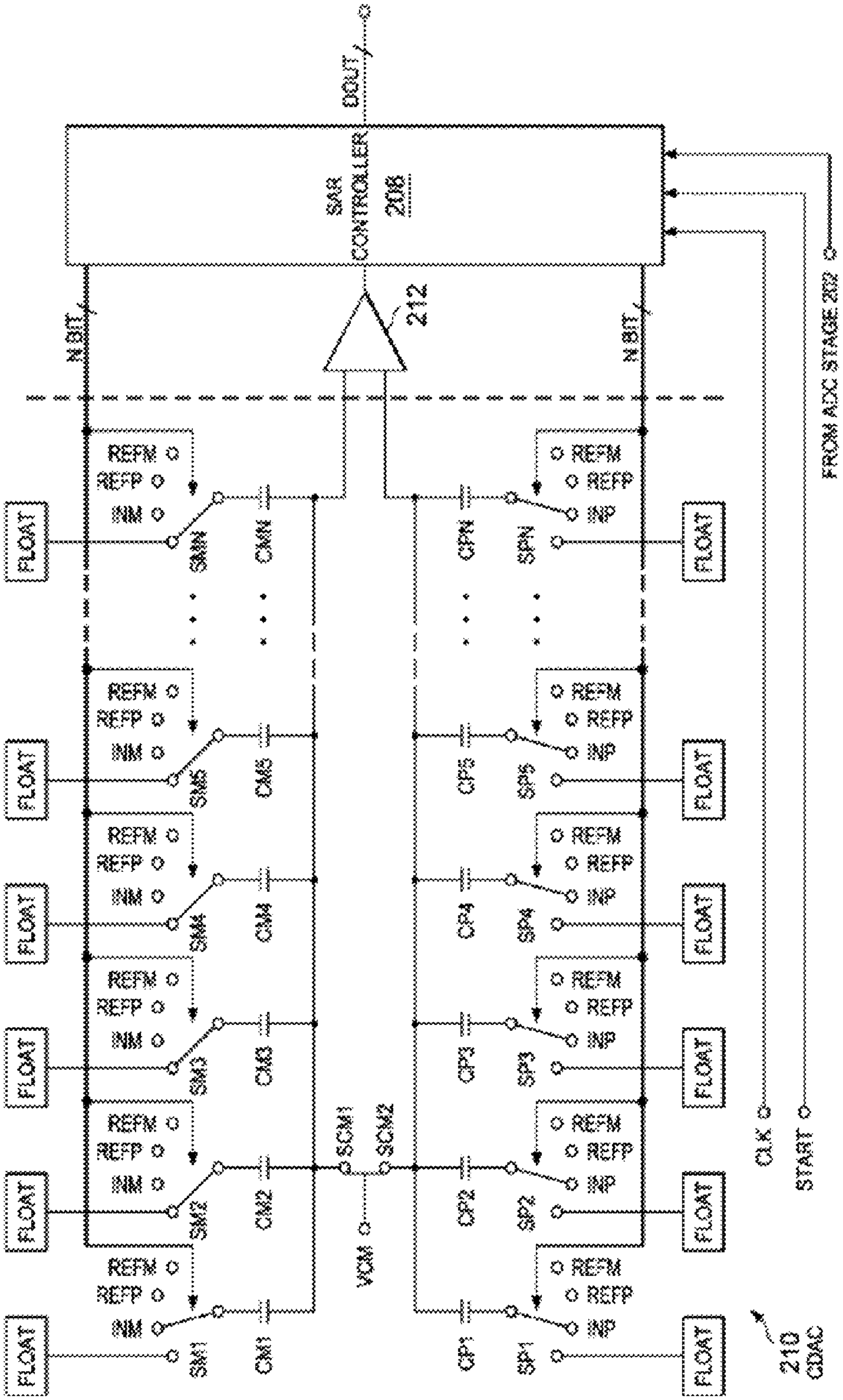
FIG. 2 Prior Art
FIG. 2 is a structural diagram illustrating a SAR ADC Scheme according to prior art.
Figure 3:
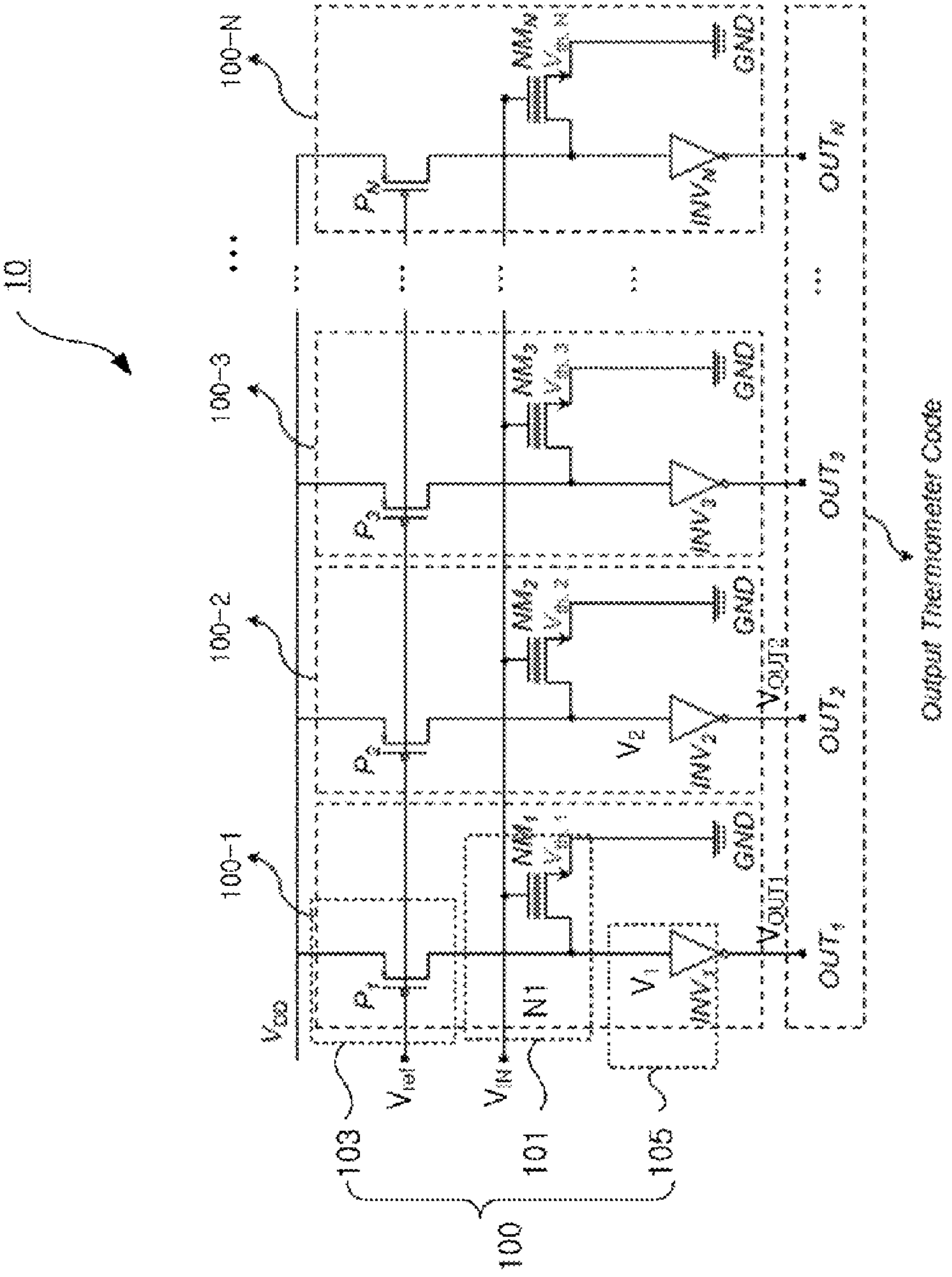
FIG. 3 is a circuit diagram illustrating an ADC structure according to the first embodiment of the present invention.

First, the structure of the ADC device according to the first embodiment will be described in detail. FIG. 3 is a circuit diagram illustrating the structure of the ADC according to the first embodiment of the present invention. Referring to FIG. 3, the ADC 10 according to the first embodiment of the present invention includes a plurality of bit detection units 100 (100-1, 100-2, 100-3, . . . , 100-N) arranged sequentially. Each of the plurality of bit detection units is configured to match one-to-one with the bits constituting the digital code and to detect and output the binary value corresponding to the matched bit from the input signal.

In order for each bit detection unit to detect the binary value corresponding to the matched bit from the input signal, the state level determination module of each bit detection unit is designed to have threshold voltage ($V_{th1}$, $V_{th2}$, . . . , $V_{thN}$) or conductance corresponding to the matched bit of the digital code, respectively. The input signal ($V_{IN}$) is applied to all the state level determination modules of the ADC. When the input signal ($V_{IN}$) is applied to the state level determination module of bit detection unit, the state of the state level determination module is determined based on the threshold voltage or conductance of the state level determination module. Then, depending on the state of the state level determination module. the charging or discharging speed of the charges on the bit line of the state level determination module in each bit detection unit varies. Consequently, the input capacitance of the output module connected to the state level determination module is determined. Then, at the measurement point, the binary value corresponding to the input voltage of the output module determined by the input capacitance of the output module is obtained. The output modules of the N bit detection units of the ADC can obtain the binary values, respectively. As a result, the ADC can obtain a digital code composed of N bits through the N bit detection units. Here, the input capacitance of the output module is defined as the ratio of the amount of charge accumulated at the input terminal of the output module to the voltage at the input terminal of the output module. Therefore, the input capacitance of the output module can be defined the equivalent capacitance of several parasitic capacitances connected to the input terminal of the output module or additional capacitances connected in parallel with the parasitic capacitances.

Each of the bit detection units includes a state level determination module 101 ($M_1$, $M_2$, $M_3$, . . . , $M_N$), a switching module 103 ($P_1$, $P_2$, $P_3$, . . . , $P_N$), and an output module 105 ($INV_1$, $INV_2$, $INV_3$, . . . , $INV_N$). The discharge of the input capacitance of the output module is determined by the threshold voltage ($V_{th}$) of the state level determination module and the input signal ($V_{IN}$). Each bit detection unit outputs a binary value which is determined according to the discharge characteristics of the input capacitance through the output module. The output binary values obtained the N bit detection units are in the form of a thermometer code and the thermometer code can be converted into a binary code by a conventional method. If it is necessary to convert the thermometer code into a binary code, it can be accomplished through an additional circuit module such as a thermometer-to-binary encoder. This method can also be applied to other embodiments described below. Hereinafter, the configuration of each component of the bit detection unit will be described in detail.

The input signal ($V_{IN}$) of the ADC is applied to the gate electrode of the state level determination module 101. Each of the state level determination modules constituting the ADC have the threshold voltage or conductance determined according to bit position of the digital code matching the corresponding bit detection unit. The state level determination module of the bit detection unit may be formed of devices whose threshold voltage or conductance can be set to arbitrary value. Depending on the type of the devices, the threshold voltage or conductance may be fixedly set at the design stage or designed to be adjusted in various ways at the operation stage by utilizing nonvolatile memory characteristics.

The device comprising the state level determination module may be implemented as a device with non-volatile memory characteristics that allow the threshold voltage or conductance to be variably adjusted, or a semiconductor device with a fixed threshold voltage or conductance that is set by adjusting parameter such as the coupling ratio or the like during the design stage.

The devices having nonvolatile memory characteristics that can be used as the state level determination module may include flash memory devices, resistive random-access memory (RRAM) devices, phase-change memory (PCM) devices, ferroelectric memory devices, magnetoresistive memory (MRAM) devices, and the like. Hereinafter, the methods for controlling threshold voltage or conductance for each device will be described.

The flash memory device can adjust the threshold voltage or conductance by applying voltage pulses to inject electrons or holes into the gate insulating layer. The electrons or holes injected into the gate insulating layer influence on the channel. By utilizing the characteristics, in the case of an n-channel flash memory device, the threshold voltage of the device can be adjusted by injecting electrons to raise the threshold voltage or injecting holes to lower the threshold voltage.

The resistive random-access memory (RRAM) device may have a structure in which a metal layer, an insulating layer and a metal layer are laminated sequentially. The RRAM device can adjust its conductance by applying voltage pulses to induce resistance changes in the intermediate insulating layer. In this process, voltage pulses may be applied in a direction that increases the conductance or in a direction that decreases the conductance.

The ferroelectric memory device can adjust the threshold voltage or conductance by forming the electric field within the insulating layer by applying voltage pulses to the ferroelectric insulating layer. In the case of a field effect transistor that utilizes the ferroelectric insulating layer as a gate insulating layer, the electric field can be formed in the direction of increasing the conductance in the ferroelectric insulating layer, or the electric field can be controlled in the direction of decreasing the conductance in the ferroelectric insulating layer. For the ferroelectric tunnel junction device, the conductance can be controlled by adjusting the tunneling probability of carriers through the direction and intensity of the electric field of the ferroelectric insulating layer.

The magnetoresistive memory device may be comprised of a fixed layer, an insulating layer, and a free layer, where both the fixed layer and the free layer are magnetic. The magnetization direction of the fixed layer is fixed, while the magnetization direction of the free layer can be changed. When the current flows in the direction from the fixed layer to the free layer in the magnetoresistive memory device, the magnetization direction of the free layer aligns with that of the fixed layer, and the conductance increases. On the other hand, when the current flows in the opposite direction—from the free layer to the fixed layer—the magnetization direction of the free layer becomes different from that of the fixed layer, and the conductance decreases. In this way, the conductance of the magnetoresistive memory device can be controlled by using the direction of the current flow.

When the state level determination module is implemented as a semiconductor device having a gate electrode or a control gate electrode, the threshold voltage of each device can be adjusted at the design stage of the device and peripheral wiring in physical layout. As an example, in cases where the device is designed to have components that serve as a floating gate and a control gate by adjusting the physical layout during the design stage, the threshold voltage or conductance can be set by controlling the coupling ratio between these gates. Additionally, in the case of devices that do not have a floating gate or a charge storage layer, the threshold voltage or conductance can be set by adjusting the coupling between the gate and the peripheral metal wiring.

In the design of the devices that make up the state-level decision module, the physical layout can be adjusted to have components that act as floating-gates and control gates. In this case, the coupling ratio may be changed depending on the gap or area ratio between the two gates. The coupling ratio is defined as the rate at which the voltage of the control gate is transferred to the floating gate. Through this approach, even semiconductor devices without memory functionality can have their threshold voltage or conductance set to various desired values.

For semiconductor devices without a floating gate, the threshold voltage can be controlled by adjusting the coupling ratio between the gate electrode and the peripheral electrodes. In this case, the gate electrode can be designed to function as a floating gate, while the peripheral electrodes can be designed to serve as control gates. By adjusting the coupling ratio between the floating gate and the control gate, the threshold voltage or conductance can be changed.

When the state level determination module is implemented with FET devices without memory function or devices with non-volatile memory characteristics, the devices can be designed to have a gate area larger than the minimum size, include dummy devices, or apply the common centroid technique. Through these methods, the precision can be increased by reducing the dispersion of the threshold voltage of the devices. Here, the area of the gate can determine the length and width of the channel formed in the device.

When the state level determination module is implemented with a device with non-volatile memory characteristics, it may further include an additional threshold voltage adjustment module. By using the threshold voltage adjustment module, the threshold voltage or conductance of each state level determination module in the analog-to-digital converter can be varied according to the bit position and resolution of the ADC.

The threshold voltage adjustment module can control the operation of the ADC by increasing or decreasing the threshold voltage or conductance of the state level determination module. The threshold voltage adjustment module may be configured as a pulse generator and can be operated by applying pulses to the nonvolatile memory device constituting the state level determination module to change its memory state.

When the state level determination module is implemented as a two-terminal device among the above devices, the operation of the device can be controlled by connecting an additional switch device. Here, the two-terminal device may be one of RRAM, PCRAM, FTJ, and MTJ. As an example of the additional switch devices, a MOSFET device with a gate electrode may be used.

The state of the state level determination module, i.e., the current driving capability, is determined by the threshold voltage ($V_{th}$) and the input signal ($V_{IN}$) applied to the gate electrode of the state level determination module with the above-described configuration. For example, if the input signal higher than the threshold voltage is applied, the state level determination module is turned on, and otherwise, the state level determination module is turned off. The input capacitance of the initially charged output module determines the discharge speed of the bit line according to the state of the state level determination module. Depending on the discharge speed of the bit line, the voltage level of the bit line of the state level determination module changes gradually or rapidly, and the output value of the output module is determined based on the voltage level of the bit line of the state level determination module at the measurement point in time.

The switching module 103 is a module for pre-charging the input capacitance of the bit line of the state level determination module. The switching module 103 may be composed of a switching device connected between a driving power supply and the bit line of the state level determination module. The switching device constituting the switching module may be implemented with one of a single MOSFET device, a plurality of MOSFET device connected sequentially, and a transmission gate device. The switching device may also be implemented with a non-volatile memory device. During the initial operation of the ADC according to the present embodiment, a pulse-shape reference voltage ($V_{ref}$) may be applied to the switching module to charge the input capacitance of the bit line of the state level determination module to $V_{DD}$. As a result, the output module connected to the bit line of the state level determination module can output a binary value of '0'.

In one example of the bit detection unit of the ADC according to the first embodiment, the state level determination module may be configured with N-type nonvolatile memory devices, and the switching module may be configured with P-type devices.

The output module 105 is a device with a predetermined switching voltage and may be composed of one of an inverter circuit, a buffer circuit, a sense amplifier, a flip-flop circuit, etc. The sense amplifier may be operated in a differential configuration.

The output module may be configured to output a binary value determined by the input voltage of the output module and a switching voltage, by connecting the input terminal to the bit line of the state level determination module. The input voltage of the output module may be determined by the input capacitance of the output module. When the output module is implemented with an inverter device, the number or structure of the inverters can be adjusted to improve the performance of the ADC. Additionally, by changing the channel width and length of the MOSFETs used in the inverter, the performance of the ADC can be improved.

The ADC according to the first embodiment with the above-described configuration may apply the input signal to the state level determination modules of a plurality of bit detection units. The input capacitance of the output module connected to each state level determination module is discharged at a slow or fast speed depending on the threshold voltage of the corresponding state level determination module. As a result, the output module of each bit detection unit can output a binary value corresponding to the respective bit. Then, a thermometer code for the input signal can be generated from the binary values output from the plurality of bit detection units constituting the ADC according to the present invention. In order to synchronize and read the bits of the thermometer code respectively generated by the plurality of bit detection units, the timing of the input pulse or the timing of reading the output values can be adjusted, and for this purpose, a circuit such as a transmission gate can be utilized.

As described above, the ADC according to the present invention can output a thermometer code consisting of N bits for the input signal. Additionally, if it is necessary to convert the thermometer code into a binary code, this can be accomplished using an additional circuit module such as a thermometer-to-binary encoder.

Figure 4:
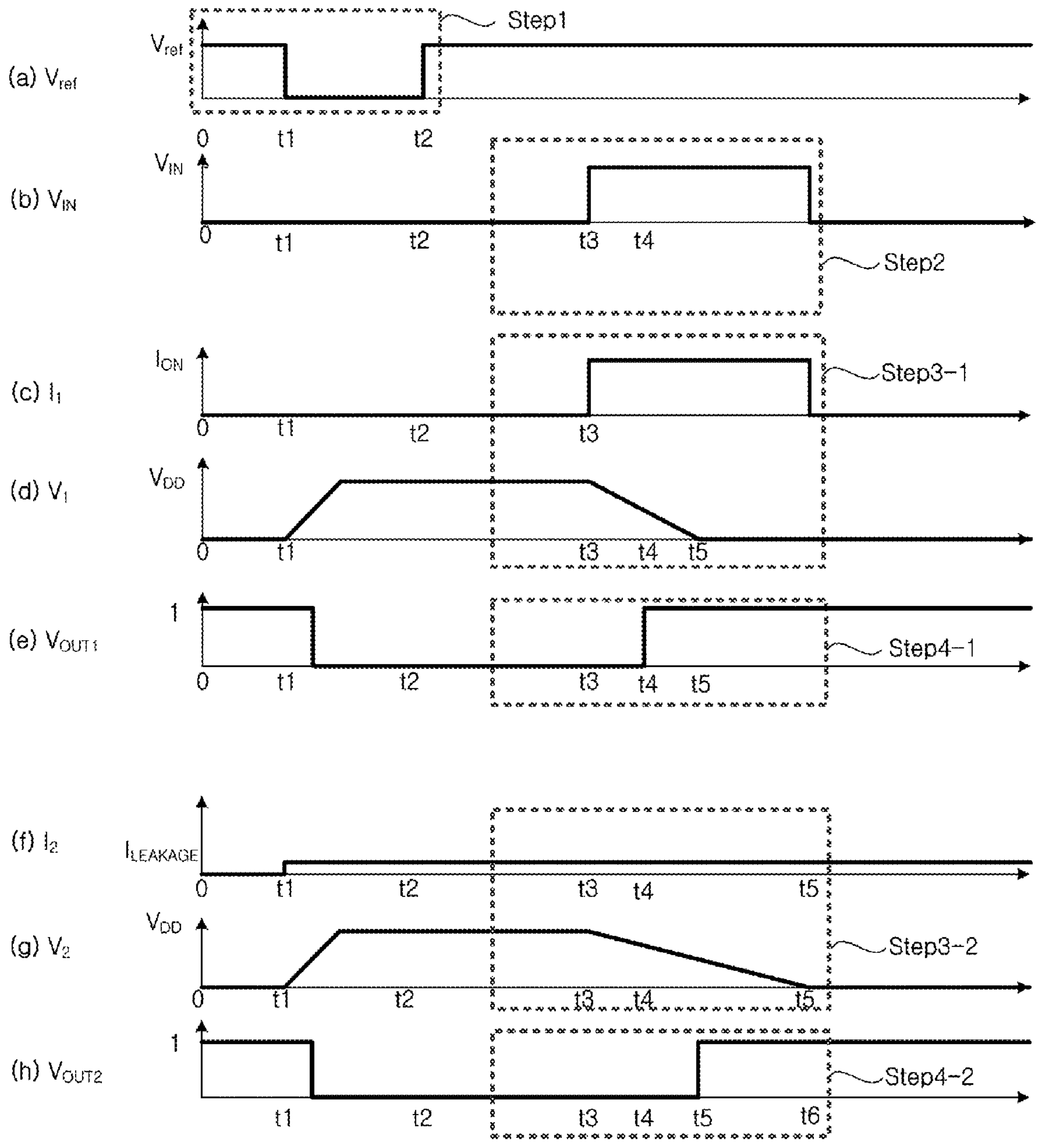
FIG. 4 is a graph exemplarily representing voltage and current at each node in the ADC according to the first embodiment of the present invention.

Hereinafter, with reference to FIG. 4, an example of the operation of the ADC according to the first embodiment of the present invention will be described in more detail. FIG. 4 is a graph representing the voltage and current at each node in the ADC according to the first embodiment of the present invention.

Referring to FIG. 4, the ADC according to the first embodiment of the present invention first may apply a pulse-shaped reference voltage ($V_{ref}$) to the gate electrodes of PMOSFET devices constituting the switching modules of the multiple bit detection units to turn on all the switching modules (Step 1). As a result, the current may be flowed into the bit lines of the state level determination modules, which are in the turn-off state and connected to the switching modules, respectively. This causes the input capacitances of the output modules to charge, so that the voltage levels of Node 1 to Node N may become $V_{DD}$. Subsequently, all the inverters, which serve as the output modules 105 connected to the bit lines of the state level determination modules, may output a binary value of '0'.

Next, the input signal ($V_{IN}$), which is an analog signal, may be applied to the gate electrodes of all the state level determination modules (Step 2).

Next, if the input signal is greater than the threshold voltage of the state level determination module, the respective module is turned on. As a result, as shown in (c) and (d) of FIG. 4, the current ($I_1$) may flow through the state level determination module, and charges accumulated in the input capacitance of the output module may be rapidly discharged through the state level determination module in the turned-on state. This may cause the voltage ($V_1$) to decrease rapidly (Step 3-1).

If the input signal is lower than the threshold voltage of the memory device, the corresponding state level determination module may remain in the turn-off state. As a result, as shown in (f) and (g) of FIG. 4, the charges accumulated in the input capacitance of the output module cannot be discharged through the state level determination module, and may be discharged at a slow rate by the flow of leakage current ($I_2$). This may cause the voltage ($V_2$) to decrease gradually (Step 3-2).

When the input signal is applied, each of the state level determination modules in the ADC may determine whether to turn on or turn off depending on their threshold voltages. Depending on the states of the state level determination modules, the discharge speeds of the input capacitances of the output modules become different. As a result, at the measurement point in time (t4<t<t5 in FIG. 4), the input voltages of the output modules of the bit detection units are determined by the discharged input capacitance, respectively.

Next, due to the differences in the discharge speed of the input capacitances of the output modules, variations may occur in the input voltages of the output modules. As a result, as shown in (e) and (h) of FIG. 4, depending on the switching voltage of the inverter constituting the output module, the output module may output a binary value of "1" or "0" at the time of measurement (Step 4-1 and 4-2).

Subsequently, the digital code consisting of N bits can be obtained from the binary values ($OUT_1$, $OUT_2$, $OUT_3$, . . . , $OUT_N$) output by each of the N bit detection units.

Figure 5:
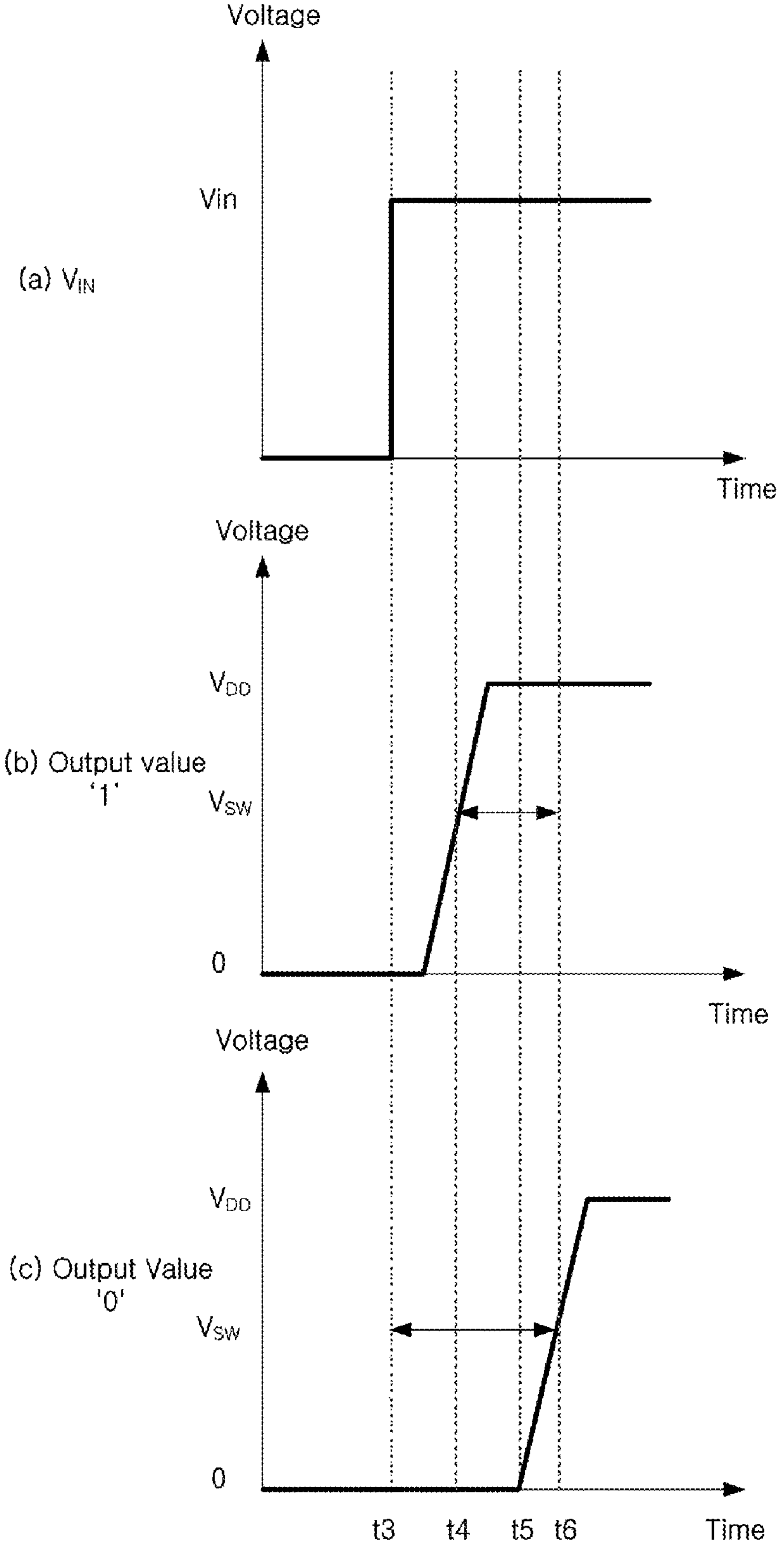
FIG. 5 is a graph exemplarily representing output signals of '1' and '0' for an input signal in the ADC according to the first embodiment of the present invention.

FIG. 5 is a graph exemplarily representing output signals of '1' and '0' in response to the input signal in the ADC according to the first embodiment of the present invention. Referring to FIG. 5, when the input signal ($V_{IN}$) is applied at the input time (t3) as shown in (a) of FIG. 5, the output module of the node discharged at a fast speed by Step 3-1 may output a binary value of '1' from the output time (t4) as shown in (b) of FIG. 5. In contrast, the output module of the node discharged at a slow speed by Step 3-2 may output a binary value of '0' until the output time (t6) as illustrated in (c) of FIG. 5. Therefore, the difference in voltage level according to the discharge speed can be detected in the form of a binary value in the range of output times t4 to t6. Accordingly, when the measurement time is set within the range of output times t4 to t6, the binary values that make up bits of the N-bit thermometer code for the input signal can be detected by using the difference in discharge times.

FIGS. 6A and 6B are diagrams exemplarily representing states of state level determination modules of bit detection units for various input signals in the ADC according to the first embodiment of the present invention. Referring to FIGS. 6A and 6B, the threshold voltages of the state level determination modules of the first to seventh bit detection units are designed to be 0.1 V, 0.2 V, 0.3 V, 0.4 V, 0.5 V, 0.6 V, and 0.7 V, respectively. In the ADC designed in this manner, when the input signal ($V_{IN}$) is 0.15 V, only the memory device of the first bit detection unit may be turned on, while the state level determination modules of the second to seventh bit detection units may be turned off. Accordingly, the thermometer code output by the output modules may become "1000000". When the input signal ($V_{IN}$) is 0.37 V, the state level determination modules of the first to third bit detection units may be turned on, and the state level determination modules of the fourth to seventh bit detection units may be turned off. Accordingly, the thermometer code output by the output modules may become "1110000". Meanwhile, when the input signal ($V_{IN}$) is 0.63 V, the state level determination modules of the first to sixth bit detection units may be turned on, and the state level determination module of the seventh bit detection unit may be turned off. Accordingly, the thermometer code output by the output modules may become "1111110".

Second Embodiment

Figure 7:
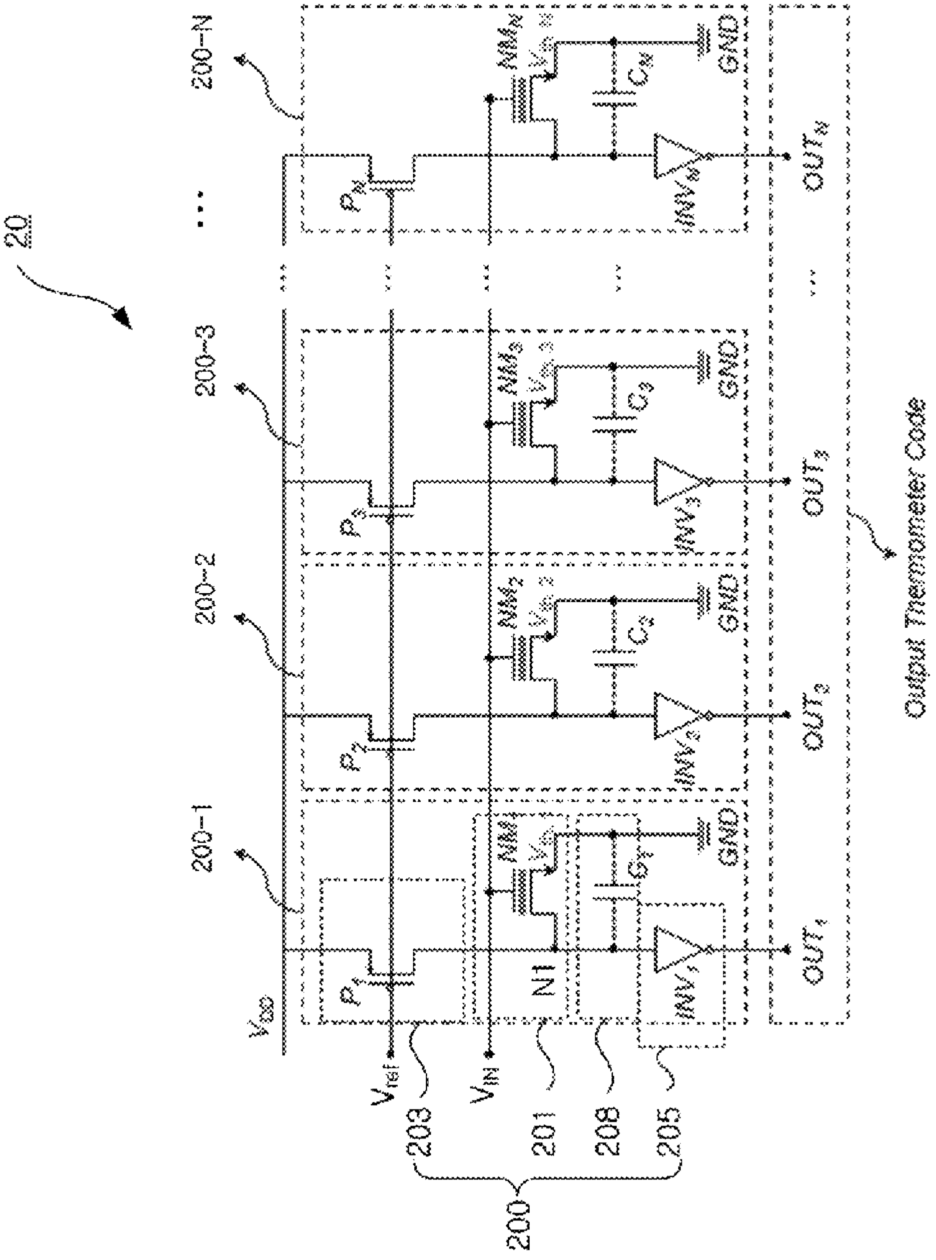
FIG. 7 is a circuit diagram illustrating the structure of the ADC according to the second embodiment of the present invention.

Hereinafter, with reference to the accompanying FIG. 7, the structure and operation of the analog-to-digital converter (ADC) according to the second embodiment of the present invention will be described in detail. FIG. 7 is a circuit diagram illustrating the structure of the ADC according to the second embodiment of the present invention. Referring to FIG. 7, the ADC 20 according to the second embodiment of the present invention includes a plurality of bit detection units 200 (200-1, 200-2, 200-3, . . . , 200-N) sequentially arranged, and these bit detection units are configured to match one-to-one with the bits constituting the digital code. Each of the bit detection units in this embodiment are characterized by further including capacitors 208 ($C_1$, $C_2$, . . . , $C_N$) for controlling the operation speed, in addition to the structure of the bit detection unit in the first embodiment. Therefore, descriptions of components that are identical to those in the first embodiment will be omitted.

The operation speed adjustment capacitor 208 is the capacitor for controlling the operation speed. The operation speed adjustment capacitor 208 in this embodiment may be connected to the bit line of the state level determination module. Thus, the capacitor 208 may be connected in parallel with the input capacitance of the output module, thereby increasing the input capacitance of the output module. The capacitor 208 may increase the charging and discharging speeds in the input capacitances of the output modules, and as a result, the operation speed of the bit detection units can be controlled.

Third Embodiment

Hereinafter, with reference to the accompanying FIG. 8, the structure and operation of the analog-to-digital converter (ADC) according to the third embodiment of the present invention will be described in detail.

Figure 8:
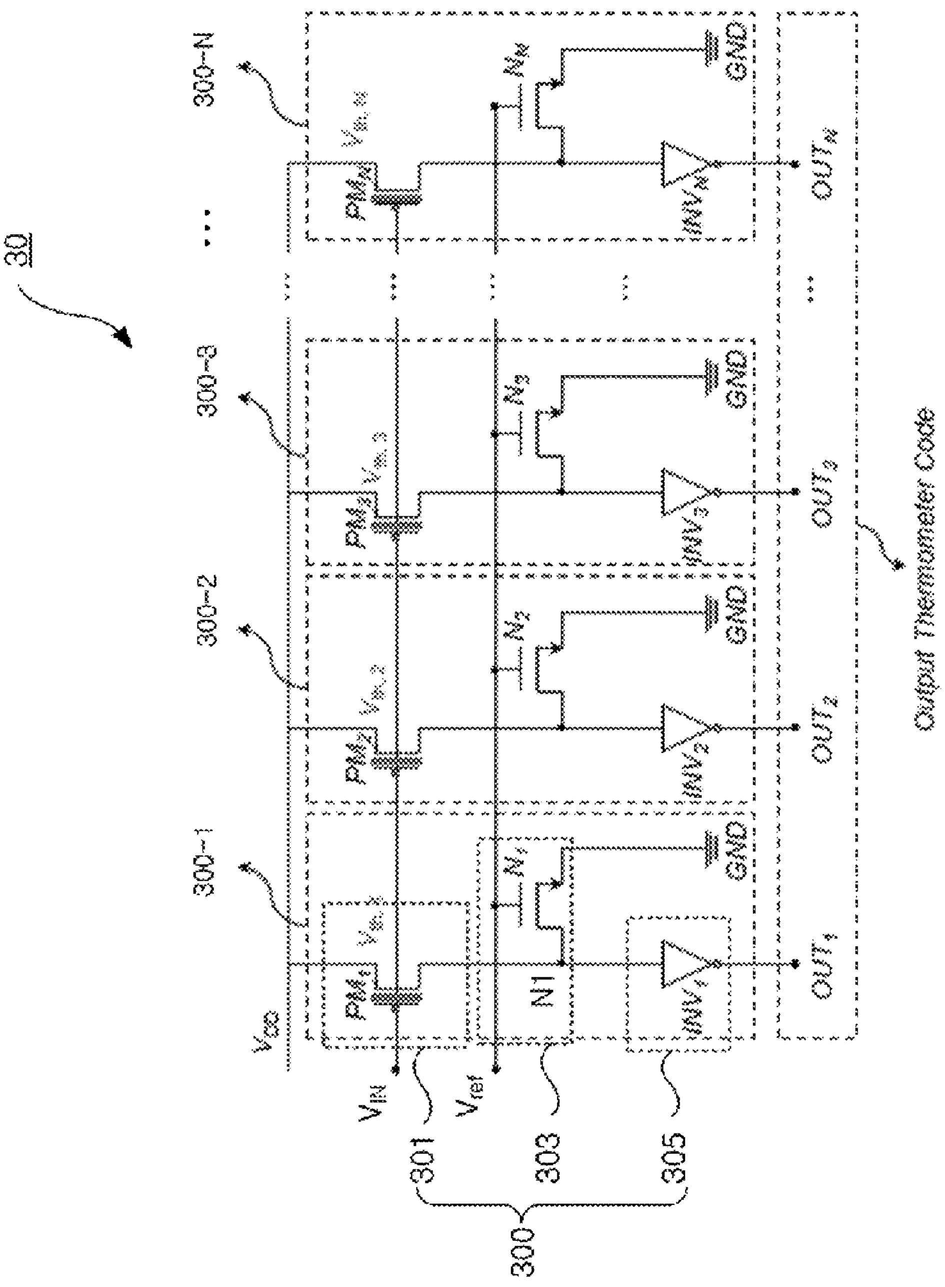
FIG. 8 is a circuit diagram illustrating the structure of the ADC according to the third embodiment of the present invention.

FIG. 8 is a circuit diagram illustrating the structure of the ADC according to the third embodiment of the present invention. Referring to FIG. 8, the ADC 30 according to the third embodiment of the present invention has a plurality of bit detection units 300 (300-1, 300-2, 300-3, . . . , 300-N) sequentially arranged, and these bit detection units are configured to match one-to-one with the bits constituting the digital code. Each of the bit detection units comprises a state level determination module 301, a switching module 303, and an output module 305. The state level determination module of the bit detection unit has the threshold voltage or conductance set according to the matched bit of the digital code. The bit detection unit outputs a binary value, determined by the threshold voltage of the state level determination module and the input signal, to the output module using the charging characteristics of the input capacitance of the output module.

The ADC according to this embodiment has a structure similar to that of the ADC in the first embodiment, but it is characterized by an opposite operating mechanism. Specifically, the ADC in the first embodiment utilizes the mechanism in which the input capacitance of the output module discharges after initial charging. In contrast, the ADC in the third embodiment operates based on the mechanism in which the input capacitance of the output module charges after initial discharging.

Hereinafter, each component of the bit detection unit according to the third embodiment will be specifically described.

The state level determination module 301 may be composed of a semiconductor device capable of variably adjusting the threshold voltage or conductance, and it is the same as the state level determination module described in the first embodiment. The switching module 303 may be composed of a switching device connected to the state level determination module. Since it is the same as the switching module described in the first embodiment, so a duplicate description will be omitted. The state level determination module according to the present embodiment is arranged between the power supply and the bit line of the switching module. The output module and the source of the state level determination module are connected to the bit line of the switching module.

The input terminal of the output module 305 is connected to the bit line of the switching module, which is connected to the state level determination module. Accordingly, the output module is configured to output a binary value corresponding to the input voltage, which may be determined by the input capacitance of the output module. Since the output module is the same as the output module described in the first embodiment, the duplicate description will be omitted.

In the bit detection unit of the ADC according to the third embodiment, the state level determination module may be composed of P-type memory devices, and the switching module may be composed of N-type devices.

Hereinafter, the operation of the ADC according to the third embodiment with the above-described configuration will be specifically described. In the ADC according to the third embodiment with the above-described configuration, during initial operation, the pulse-shaped reference voltage ($V_{ref}$) greater than the threshold voltage of the switching modules is applied to the gate electrodes of the switching modules to turn on all the switching modules. As the switching modules are turned on, the input capacitances of the output modules connected to the bit lines of the switching modules may be all initially discharged, causing the voltage at Node 1 to drop to 0 V, and all the output modules may output the binary value of '1'.

Next, each bit detection unit applies the input signal ($V_{IN}$) to the gate electrode of the state level determination module. The state level determination module turns on or off depending on its threshold voltage.

If the state level determination module is turned on, the input capacitance of the bit line of the switching module may be charged at a fast speed. However, if the state level determination module is turned off, the input capacitance of the output module may be charged at a slow speed due to the leakage current of the state level determination module. This charging of the input capacitance of the output module causes the input voltage of the output module to change.

However, depending on whether the state level determination module is in the on or off state, differences arise in the charging speed of the input capacitance of the output module. In cases where the charging speed is fast, Node 1 quickly reaches the VDD voltage, and the output module may output a binary value of "0" at the measurement point. On the other hand, if the charging speed is slow, Node 1 does not reach the VDD voltage within a short time, and the output module may output a binary value of "1" at the measurement point. Thus, based on the differences in the charging speed of the input capacitance of the output module, the output module may output either "0" or "1" as a binary value at the measurement point.

Consequently, the digital code consisting of N bits is obtained from the binary values ($OUT_1$, $OUT_2$, $OUT_3$, . . . , $OUT_N$) output by the N bit detection units, respectively.

Fourth Embodiment

Hereinafter, with reference to the accompanying FIG. 9, the structure and operation of the analog-to-digital converter (ADC) according to the fourth embodiment of the present invention will be described in detail.

Figure 9:
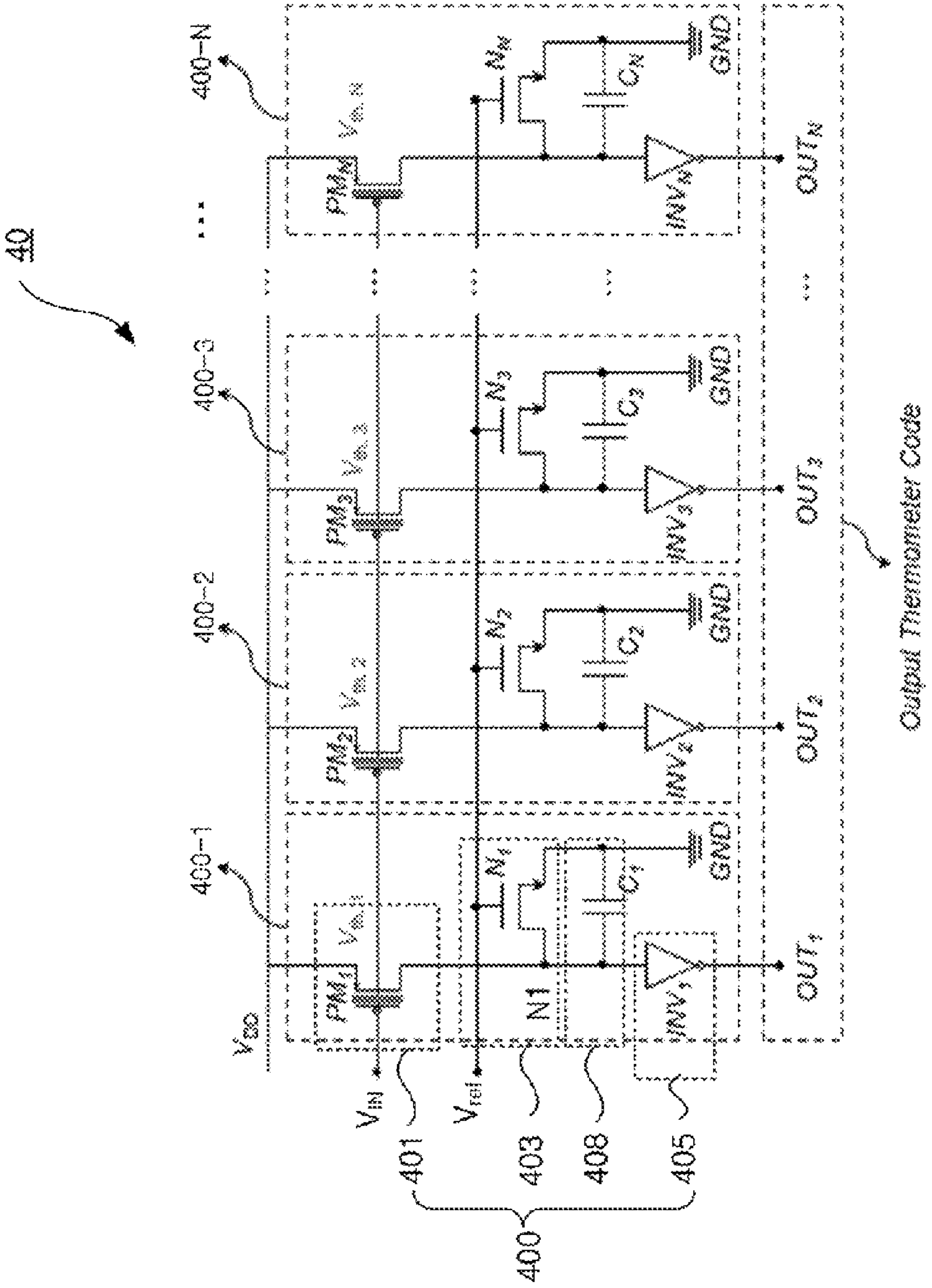
FIG. 9 is a circuit diagram illustrating the structure of the ADC according to the fourth embodiment of the present invention.

FIG. 9 is a circuit diagram illustrating the structure of the ADC according to the fourth embodiment of the present invention. Referring to FIG. 9, the ADC 40 according to the fourth embodiment of the present invention has a plurality of bit detection units 400 (400-1, 400-2, 400-3, . . . , 400-N) sequentially arranged, and these bit detection units are configured to match one-to-one with bits constituting the digital code, respectively. Each of the bit detection units according to the present embodiment is characterized in that it further has a capacitor 408 ($C_1$, $C_2$, . . . , $C_N$) for controlling the operation speed in addition to the structure of the bit detection unit in the third embodiment. Descriptions of configurations of the fourth embodiment that overlap with those of the third embodiment will be omitted.

The operation speed adjustment capacitors 408 according to the present embodiment are connected to the bit lines of the switching modules 403, respectively. The operation speed adjustment capacitors 408 are connected in parallel with the input capacitances of the output modules, respectively, thereby increasing the input capacitances of the output modules. Accordingly, the operation speed adjustment capacitors 408 may increase the discharge and charge speed of the input capacitances of the output modules, and as a result, the operation speed of the bit detection units can be controlled.

Fifth Embodiment

Hereinafter, with reference to the accompanying FIG. 10, the structure and operation of the analog-to-digital converter according to the fifth embodiment of the present invention will be described in detail.

Figure 10:
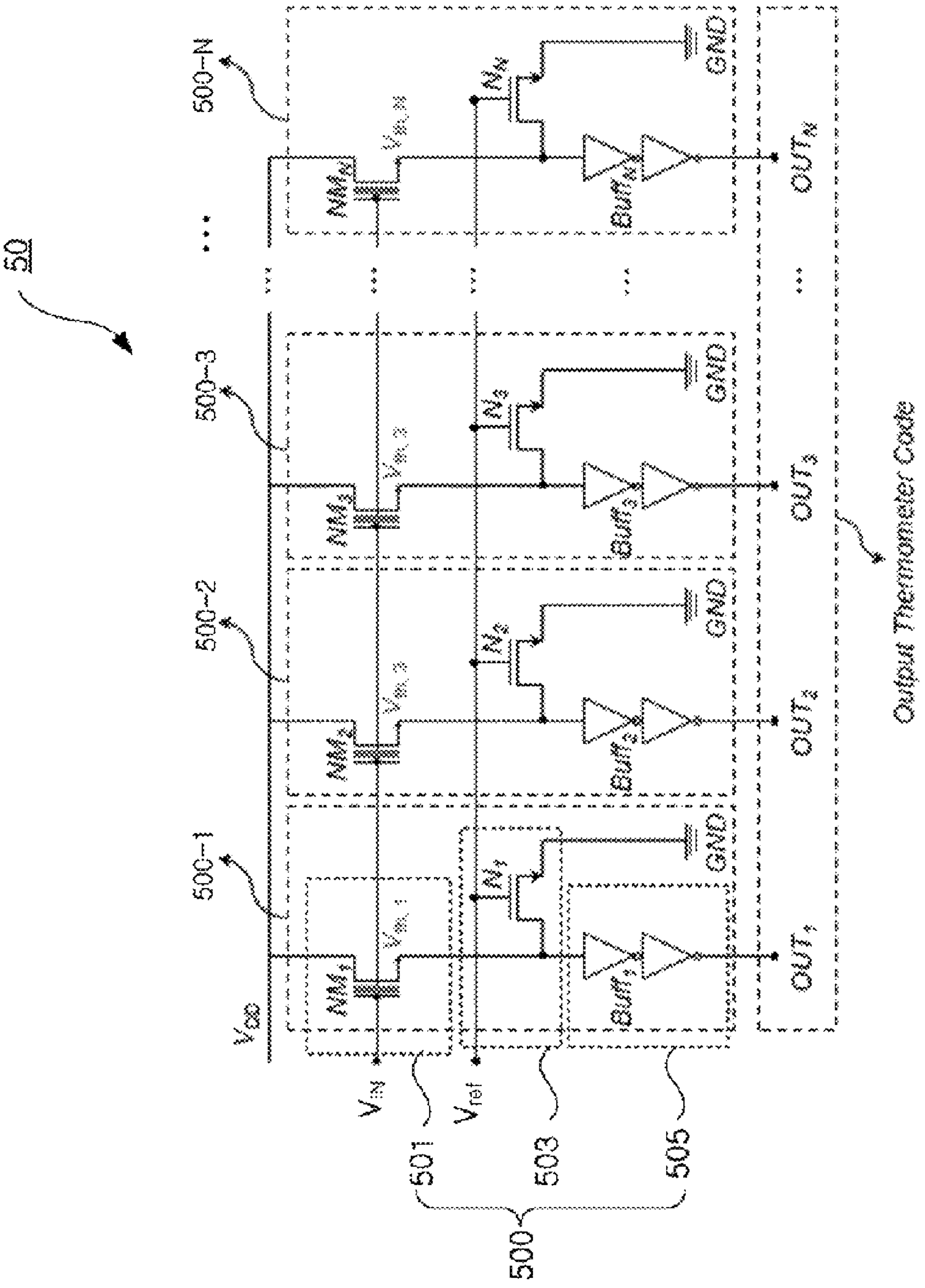
FIG. 10 is a circuit diagram illustrating the structure of the ADC according to the fifth embodiment of the present invention.

FIG. 10 is a circuit diagram illustrating the structure of the ADC according to the fifth embodiment of the present invention. Referring to FIG. 10, the ADC 50 according to the fifth embodiment of the present invention has a plurality of bit detection units 500 (500-1, 500-2, 500-3, . . . , 500-N) sequentially arranged, and these bit detection units are configured to match one-to-one with bits constituting a digital code, respectively. Each of the bit detection units has a state level determination module 501, a reference current source 503, and an output module 505. The state level determination module of the bit detection unit has the threshold voltage or conductance set according to the matched bit of the digital code. The bit detection unit outputs a binary value determined by the difference (Gap) between the input signal ($V_{IN}$) and the threshold voltage ($V_{th}$) of the state level determination module to the output module. Hereinafter, the components of the bit detection unit will be described in detail.

The state level determination module 501 can be implemented with a semiconductor device capable of setting a threshold voltage or conductance, and is the same as the state level determination module described in the first embodiment, so that the redundant explanations will be omitted. The state level determination module 501 may be configured to receive the input signal at its gate electrode. The state level determination module is designed to have a threshold voltage or conductance determined according to the bit of the digital code matched to the respective bit detection unit. The bit line of the state level determination module may be connected to the power supply, and the source side of the state level determination module may be connected to the bit line of the reference current source and the input terminal of the output module.

The reference current source 503 may be configured as a device that provides a reference current ($I_{ref}$) to the state level determination module. The reference current may serve as the reference current for comparison when the state level determination module is turned on.

The reference current source may be implemented as one of a flash memory device, a single MOSFET, multiple MOSFETs connected in sequence, and a transmission gate device. When the reference voltage ($V_{ref}$) is applied to the gate electrode of the reference current source, it supplies the reference current ($I_{ref}$) to the state level determination module for comparison when the threshold voltage is applied to the state level determination module.

When the reference current source configured to provide the reference current of the state level determination module is implemented as the flash memory device or the FET devices, the reference current value can be set differently between the bit detection units by varying the channel width of each device.

In the bit detection unit of the ADC according to the fifth embodiment, the state level determination module and the reference current source may be composed of N-type devices.

The input terminal of the output module 505 is connected to the source side of the state level determination module. Therefore, the input voltage of the out module may be determined based on the voltage level at the source of the state level determination module, and the output module may be output a binary value corresponding to the input voltage of the output module. The output module may be implemented as inverter devices, buffer circuits, a sense amplifier, or a flip flop circuit. If the output module is implemented using the inverter devices, the number or structure of the inverter may be adjusted to improve the performance of the ADC. Since the output module is the same as the output module described in the first embodiment, redundant explanations will be omitted.

Figure 11:
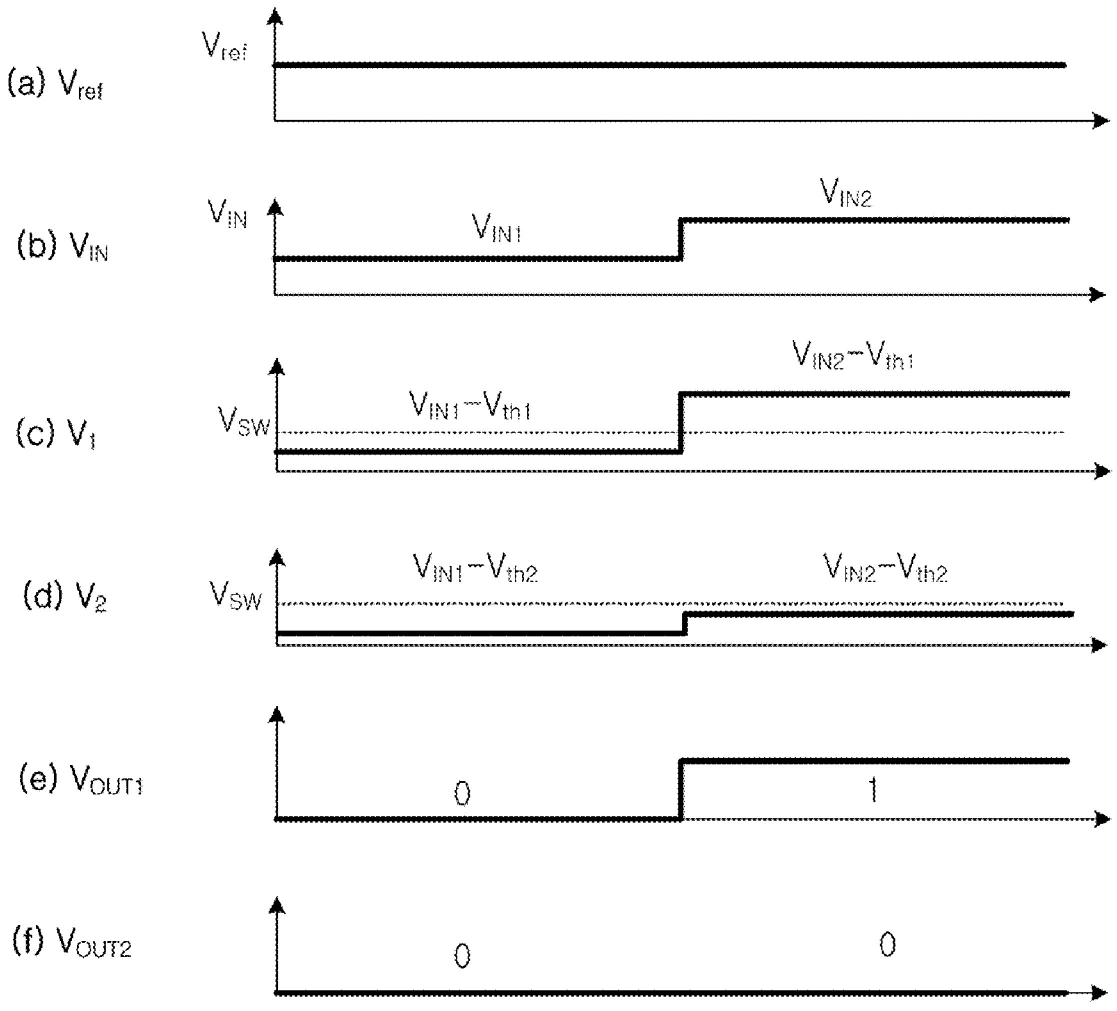
FIG. 11 is a graph exemplarily representing voltage and current at each node according to the input signal in the ADC according to the fifth embodiment of the present invention.

Hereinafter, with reference to FIG. 11, the operation of the ADC according to the fifth embodiment with the above-described configuration will be described in detail. FIG. 11 is a graph illustrating the voltage and current at each node based on the input signal in the ADC according to the fifth embodiment of the present invention. As shown in (a) and (b) of FIG. 11, the reference voltage ($V_{ref}$) is applied to the gate electrode of the reference current source, and the input signal ($V_{IN}$) is applied to the gate electrode of the state level determination module. Here, the state level determination module of the first bit detection unit has a first threshold voltage ($V_{th1}$), and the state level determination module of the second bit detection unit has a second threshold voltage ($V_{th2}$).

At this point, as shown in (c) of FIG. 11, when the input signal ($V_{IN}$) greater than the threshold voltage ($V_{th1}$) is applied to the gate electrode of the state level determination module, the state level determination module may be turned on, the voltage of $V_{IN}$-$V_{th}$ may be applied to the source side of the state level determination module, and the reference current ($I_{ref}$) may be flowed through the reference current source. Additionally, the voltage of $V_{IN}$-$V_{th}$ may be input to the output module connected to the source side of the state level determination module. As shown in (e) of FIG. 11, when the voltage ($V_{IN}$-$V_{th}$) applied to the input terminal of the output module exceeds the switching voltage ($V_{SW}$) of the buffer or inverter constituting the output module, the output module may be output a binary value of 1.

On the other hand, as shown in (d) of FIG. 11, when the input signal ($V_{IN}$) less than the threshold voltage ($V_{th}$) is applied to the gate electrode of the state level determination module, the state level determination module may be turned off and the source side of the state level determination module may be became 0 volt. As shown in (f) of FIG. 11, if the voltage applied to the input of the output module does not exceed the switching voltage ($V_{SW}$) of the output module, the output module may output a binary value of '0'.

From the binary values ($OUT_1$, $OUT_2$, $OUT_3$, . . . , $OUT_N$) output by the N bit detection units performing the aforementioned operations, respectively, the digital code consisting of N bits can be obtained. The digital code may be in the form of the thermometer code.

As described above, the bit detection units constituting the ADC according to the present embodiment may determine the input voltage of the output module and the output value of the output module based on the threshold voltage ($V_{th}$) of the state level determination module and the input signal ($V_{IN}$) applied to the gate electrode of the state level determination module. Therefore, the ADC according to the fifth embodiment of the present invention can convert the input voltage into a digital code by using state level determination modules with different threshold voltages.

Sixth Embodiment

Hereinafter, the structure and operation of an analog-to-digital converter according to the sixth embodiment of the present invention will be specifically described with reference to the attached FIG. 12.

Figure 12:
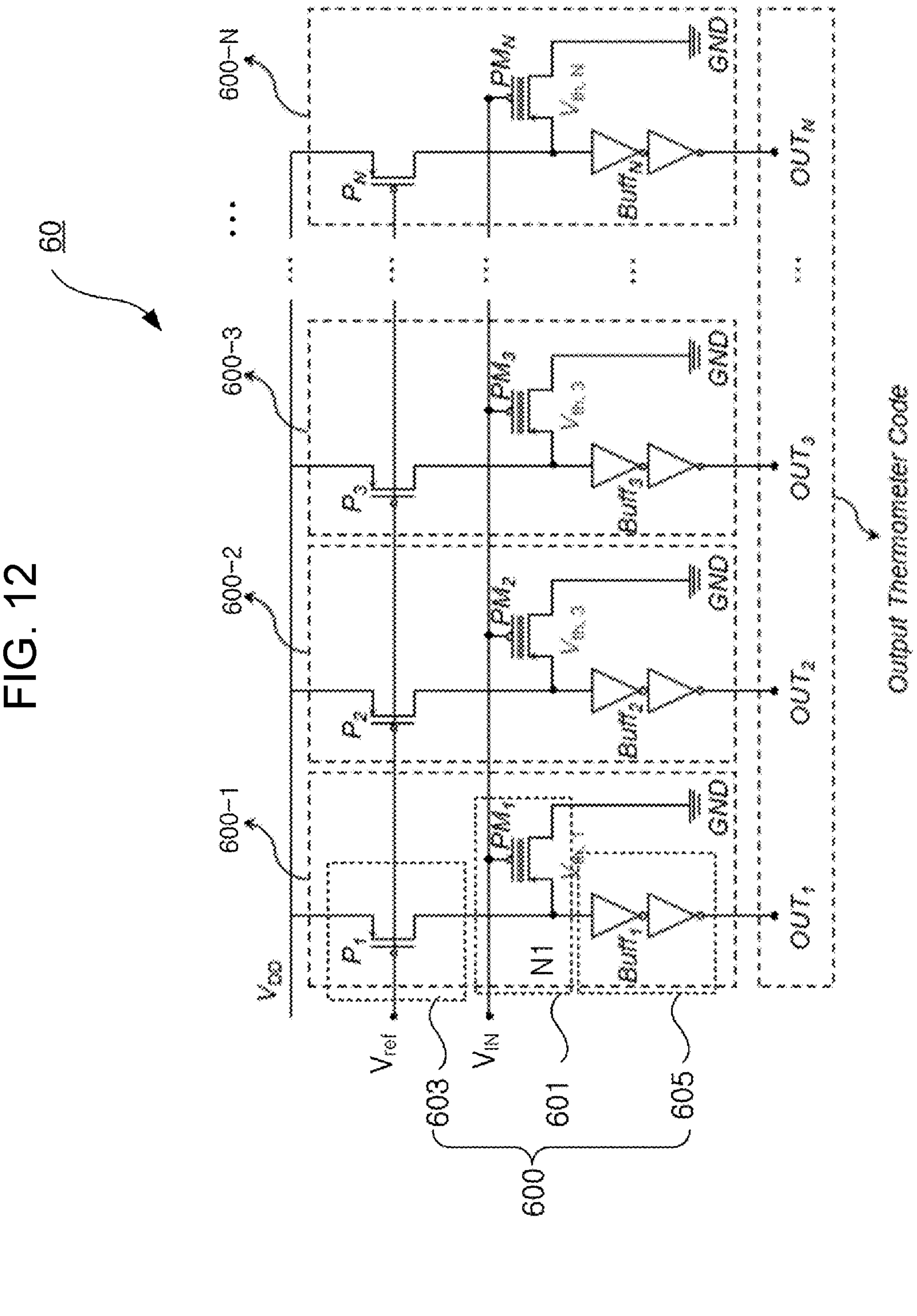
FIG. 12 is a circuit diagram illustrating the structure of the ADC according to the sixth embodiment of the present invention.

FIG. 12 is a circuit diagram illustrating the structure of the ADC according to the sixth embodiment of the present invention. Referring to FIG. 12, the ADC 60 according to the sixth embodiment of the present invention has a plurality of bit detection units 600 (600-1, 600-2, 600-3, . . . , 600-N) sequentially arranged. The bit detection units are configured to match one-to-one with bits constituting the digital code, respectively. Additionally, the bit detection units according to the sixth embodiment have a structure similar to those of the bit detection units of the fifth embodiment. However, unlike the fifth embodiment, the bit detection units in the ADC of the sixth embodiment are characterized by having the state level determination module implemented as a P-type memory device and the reference current source implemented as a P-type device.

Therefore, the ADC according to the sixth embodiment generates current flow in the opposite direction compared to the ADC in the fifth embodiment. The state level determination module, reference current source, and output module of the bit detection unit in the sixth embodiment are identical to those in the fifth embodiment, and thus overlapping explanations are omitted.

The state level determination module 601 may be designed to have a threshold voltage or conductance determined based on the bit of the digital code matched to the corresponding bit detection unit, and the input signal may be applied to its gate electrode. The bit line of the state level determination module is connected to the reference current source and the input terminal of the output module. The reference current source 603 may be configured as a device that provides the reference current ($I_{ref}$) to the state level determination module. If the reference voltage ($V_{ref}$) is applied to the gate electrode of the reference current source, the reference current source may supply the reference current ($I_{ref}$) when the threshold voltage is applied to the state level determination module.

The input terminal of the output module 505 may be connected to the bit line of the state level determination module, and the input voltage of the output module may be determined by the voltage level of the state level determination module. Therefore, the output module may be output a binary value corresponding to the input voltage. The output module can be implemented as one of an inverter device, a buffer circuit, or a sense amplifier. If the output module is implemented as the inverter device, the number or structure of inverters can be adjusted to enhance the performance of the ADC.

Seventh Embodiment

Hereinafter, with reference to the accompanying drawings, the structure and operation of the analog-to-digital converter (ADC) according to the seventh embodiment of the present invention will be described in detail.

Figure 13:
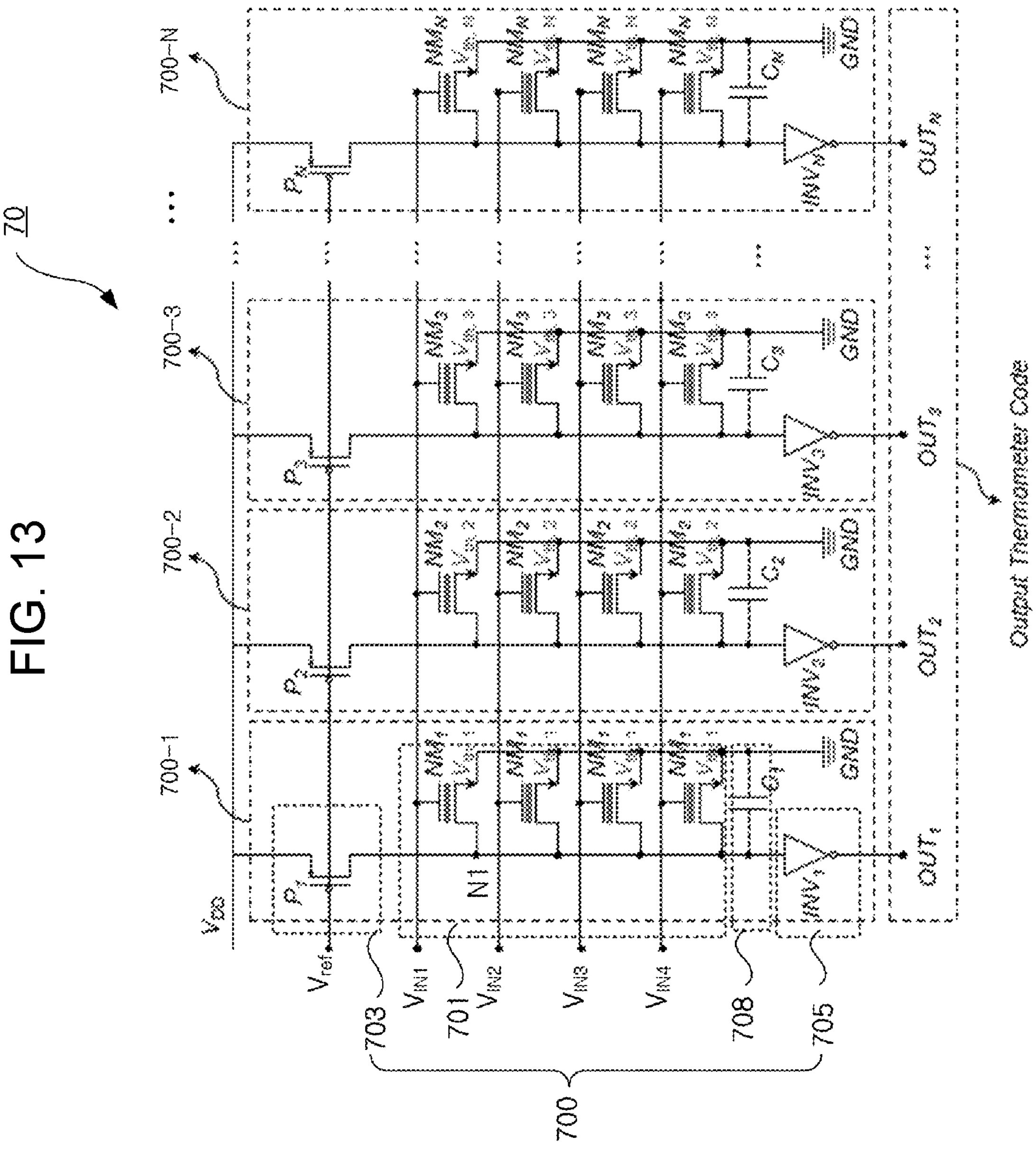
FIG. 13 is a circuit diagram illustrating the structure of the ADC according to the seventh embodiment of the present invention.

FIG. 13 is a circuit diagram illustrating the structure of the ADC according to the seventh embodiment of the present invention.

Referring to FIG. 13, the ADC 70 according to the seventh embodiment of the present invention has a plurality of bit detection units 700 (700-1, 700-2, 700-3, . . . , 700-N) sequentially arranged. The bit detection units are configured to match one-to-one with the bits constituting the digital code, respectively. The bit detection units may be designed to detect and output binary values corresponding to the matched bits of the digital code from multiple input signals.

The ADC according to the present invention is characterized in that each of the bit detection units has multiple state level determination modules with predetermined threshold voltage($V_{th}$). Therefore, each of the bit detection units can detect a binary value corresponding to the matched bit of the digital code from the multiple input signals ($V_{IN}$1, $V_{IN}$2, $V_{IN}$3, $V_{IN}$4).

Each of the bit detection units comprises multiple state level determination modules 701 ($NM_1$, $NM_2$, $NM_3$, . . . , $NM_N$), a switching module 703 ($P_1$, $P_2$, $P_3$, . . . , $P_N$), and an output module 705 ($INV_1$, $INV_2$, $INV_3$, . . . , $INV_N$). The multiple state level determination module of the bit detection unit has the threshold voltage or conductance set according to the bit position of the digital code. In addition, the bit detection unit may further comprise a capacitor 708 ($C_1$, $C_2$, . . . , $C_N$) for controlling the operation speed. Hereinafter, each component of the bit detection unit will be described in detail.

Each of the bit detection units may include multiple state level determination modules 701. The multiple state level determination modules included in a single bit detection unit have the same threshold voltage. These multiple state level determination modules 701 within the bit detection unit are connected in parallel to a common bit line. In Addition, the multiple input signals may be applied to the gate electrodes of the respective state level determination modules. The state level determination modules 701 are composed of semiconductor devices capable of setting a threshold voltage or conductance. Since the description of the state level determination module is identical to that in the first embodiment, redundant explanations are omitted.

The state level determination modules 701 provided in a single bit detection unit may be designed to have same threshold voltage or conductance determined according to the bit of the digital code matched to the corresponding bit detection unit. Accordingly, in each bit detection unit, the input capacitance of the output module connected to the common bit line of the state level determination modules can be charged or discharged depending on the threshold voltages ($V_{th}$) of the state level determination modules and the input signals ($V_{IN1}$, $V_{IN2}$, $V_{IN3}$, $V_{IN4}$) applied to the gate electrodes of the state level determination modules. The charging and discharging of the input capacitance of the output module may cause changes in the input voltage of the output module, thereby determining the output value of the output module.

Meanwhile, it is desirable to minimize the dispersion of threshold voltages of the multiple state level determination modules constituting a single bit detection unit. Therefore, the multiple state level determination modules within a single bit detection unit should preferably be fabricated with dimensions larger than the minimum feature size. In particular, it is even more desirable to fabricate the multiple state level determination modules constituting a single bit detection unit with dimensions that ensure they have identical threshold voltages.

In addition, the multiple state level determination modules constituting a single bit detector can be manufactured by applying the common centroid layout technique which shares a single center. Thus, the dispersion of threshold voltages according to the arrangement positions of the multiple state level determination modules can be reduced.

The switching module 703 serves as a module for pre-charging the input capacitance of the output module and can be configured with a switching device connected between the power supply and the bit line of the state level determination module. The switching device constituting the switching module may be implemented as a single MOSFET device, multiple MOSFET devices connected in sequence, or a transmission gate device. During the initial operation of the ADC according to this embodiment, the pulse-shaped reference voltage may be applied to the switching module to charge the input capacitance of the output module, thereby enabling the output module to output "0" signal.

In the initial stage of ADC operation, to charge the state level determination modules and initialize the output value of the output module to "0", the multiple state level determination modules in the seventh embodiment may be composed of N-type memory devices, while the switching modules may be composed of P-type devices, which are of the opposite type.

The input terminal of the output module 705 is connected to the common bit line of the state level determination modules. The output module 705 may be configured to receive the voltage level of the common bit line as input and output a binary value determined by the switching voltage of the inverter. The output module can be implemented as an inverter device or a buffer circuit or a sense amplifier. If the output module is implemented as the inverter device, the number or structure of the inverter can be adjusted to improve the performance of the ADC.

Figure 14:
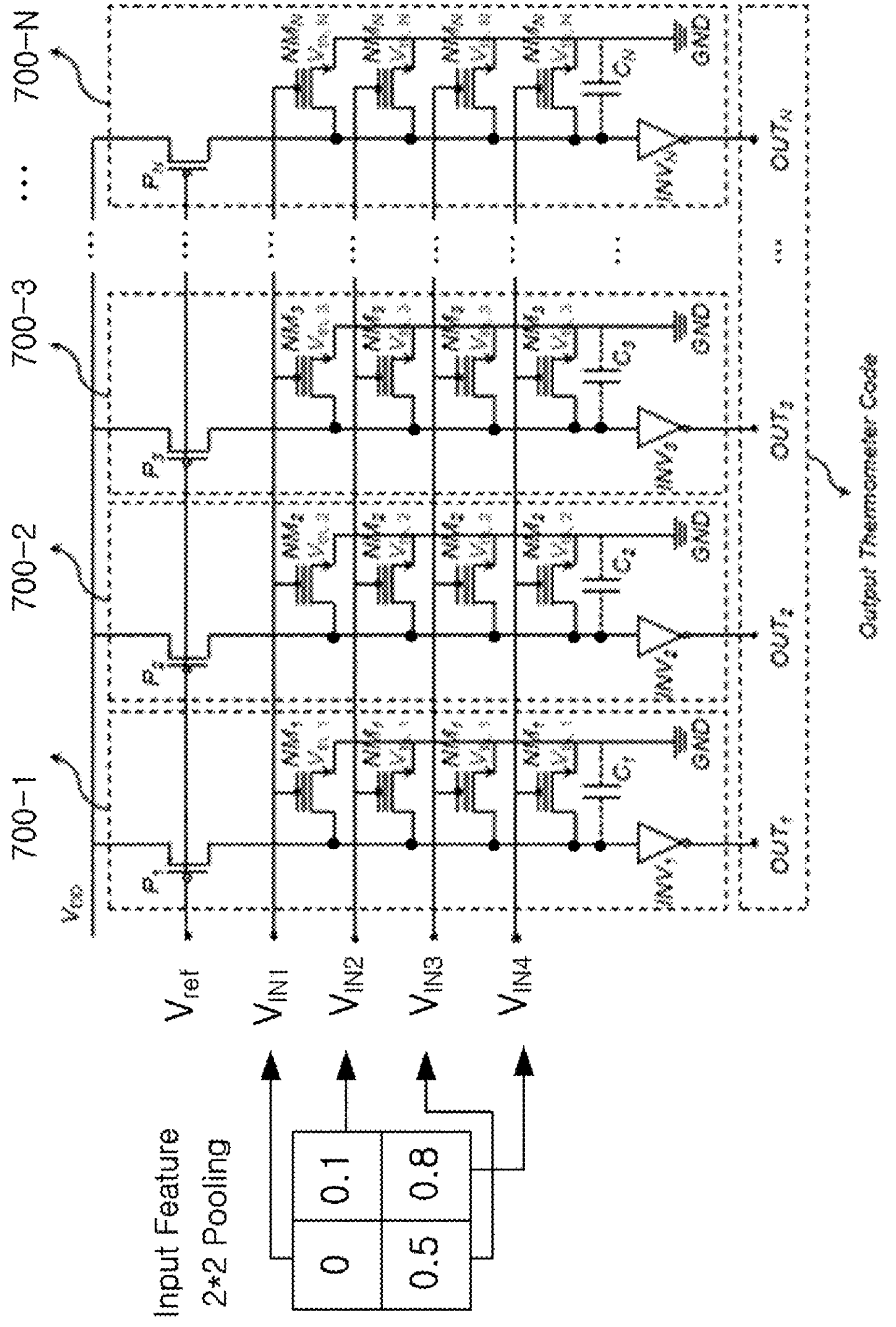
FIG. 14 is a schematic diagram exemplarily representing input voltages to explain the pooling operation in the ADC according to the seventh embodiment of the present invention.

Hereinafter, the operation of the ADC according to the seventh embodiment of the present invention will be described in detail with reference to FIG. 14. FIG. 14. is a schematic diagram illustrating the input voltages in the ADC according to the seventh embodiment of the present invention, specifically for explaining the pooling operation. Referring to FIG. 14, the ADC according to the seventh embodiment may be designed to allow multiple input voltages to be applied simultaneously. As a result, the output modules can generate a digital code corresponding to a pooled value of the input voltages in an arbitrary pooling manner.

In the ADC according to this embodiment, the pulse-shaped reference voltage ($V_{ref}$) is applied to the gate electrodes of the PMOSFET devices constituting the switching modules to turn on all the switching modules. As a result, current may be flowed into the common bit line of the state level determination modules that are in the turn-off state and are connected to the switching modules. This current flow may charge the input capacitances of the output modules, causing the voltage levels of Node 1 to Node N to reach $V_{DD}$. Consequently, the inverters, which are the output modules connected to the bit lines of the state level determination modules, may be output a binary value of "0".

Next, multiple input signals ($V_{IN1}$, $V_{IN2}$, $V_{IN3}$, $V_{IN4}$), which are analog signals, are input to the gate electrodes of the state level determination modules equipped in each bit detection unit.

Next, when the input signal exceeds the threshold voltage of the state level determination module, the corresponding state level determination module may be turned on. As a result, the charges stored in the input capacitance of the output module may be discharged at a fast rate through the turned-on state level determination module. When the input signal is less than the threshold voltage of the state level determination module, the corresponding state level determination module may be remained in the turned-off state. Consequently, the charges accumulated in the input capacitance of the output module may be discharged at a slow rate due to leakage current.

When multiple input signals are applied, the state level determination modules constituting a single bit detection unit may be turned on or off depending on their threshold voltages and the applied input signals. The discharge speed of the input capacitance of the output module may be varied according to the total current determined by the states of the state level determination modules. As a result, at the measurement point, the voltage level of the bit line of the state level determination module in each bit detection unit may be determined by the discharged input capacitance.

Next, due to the differences in the discharge speed of the input capacitances of the output modules in the bit detection units, the input voltages of the output modules of the bit detection units also differ. As a result, depending on the switching voltage ($V_{SW}$) of the inverter constituting the output module, the output module may output a binary value of "0" or "1" corresponding to the input voltage at the measurement point. Then, from the binary values ($OUT_1$, $OUT_2$, $OUT_3$, . . . , $OUT_N$) output by each of the N bit detection units, the digital code consisting of N bits can be obtained.

Figure 15:
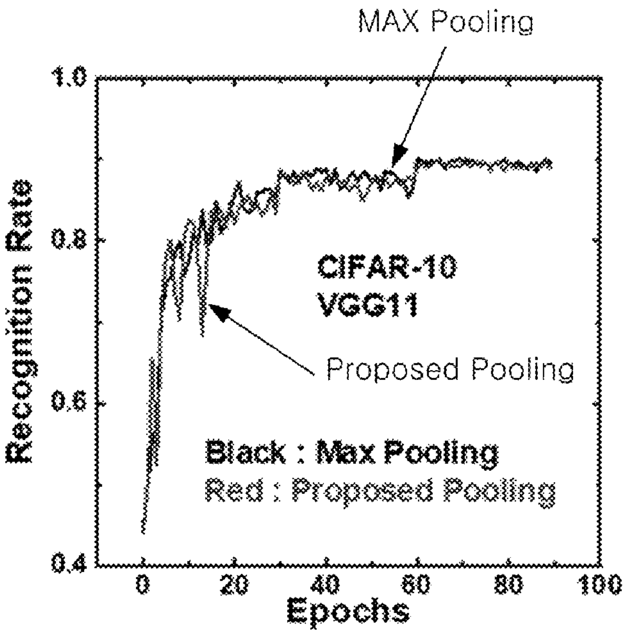
FIG. 15 is a graph exemplarily representing the results of the general MAX pooling operation and the pooling operation according to the present invention in the ADC according to the seventh embodiment of the present invention.

Hereinafter, the pooling operation according to the present embodiment will be described. FIG. 15 is a graph comparing the results of pooling in a commonly used MAX pooling and the ADC according to the seventh embodiment of the present invention. In FIG. 15, the graph in black color shows the typical MAX pooling, and the graph in red color shows the pooling according to the present invention.

First, it is assumed that the current for the input voltage is $I=Ae^{V}$ based on the subthreshold region of the multiple state level determination modules that constitute a single bit detection unit. Based on this assumption, the total current for pooling the four input voltages is $\Sigma I=A(e^{V_1}+e^{V_2}+e^{V_3}+e^{V_4})$. A single input voltage that generates the same current as the total current can be represented $Ae^{V}=A(e^{V_1}+e^{V_2}+e^{V_3}+e^{V_4})$. Therefore, the single input voltage (V) is given by $V=\text{In}(e^{V_1}+e^{V_2}+e^{V_3}+e^{V_4})$.

When the ADC according to the present invention operates for the pooling operation, by using the magnitude of bit line capacitance as four times that of the conventional structure, the pooling operation in the form of an exponential average with the magnitude of V according to the following formula can be implemented.

$$V = \ln\left(\frac{e^{V_1} + e^{V_2} + e^{V_3} + e^{V_4}}{4}\right)$$

Through FIG. 15, it can be seen that the ADC according to the present invention can perform a pooling operation similar to MAX Pooling, which is essential in convolution operations.

Eighth Embodiment

Figure 16:
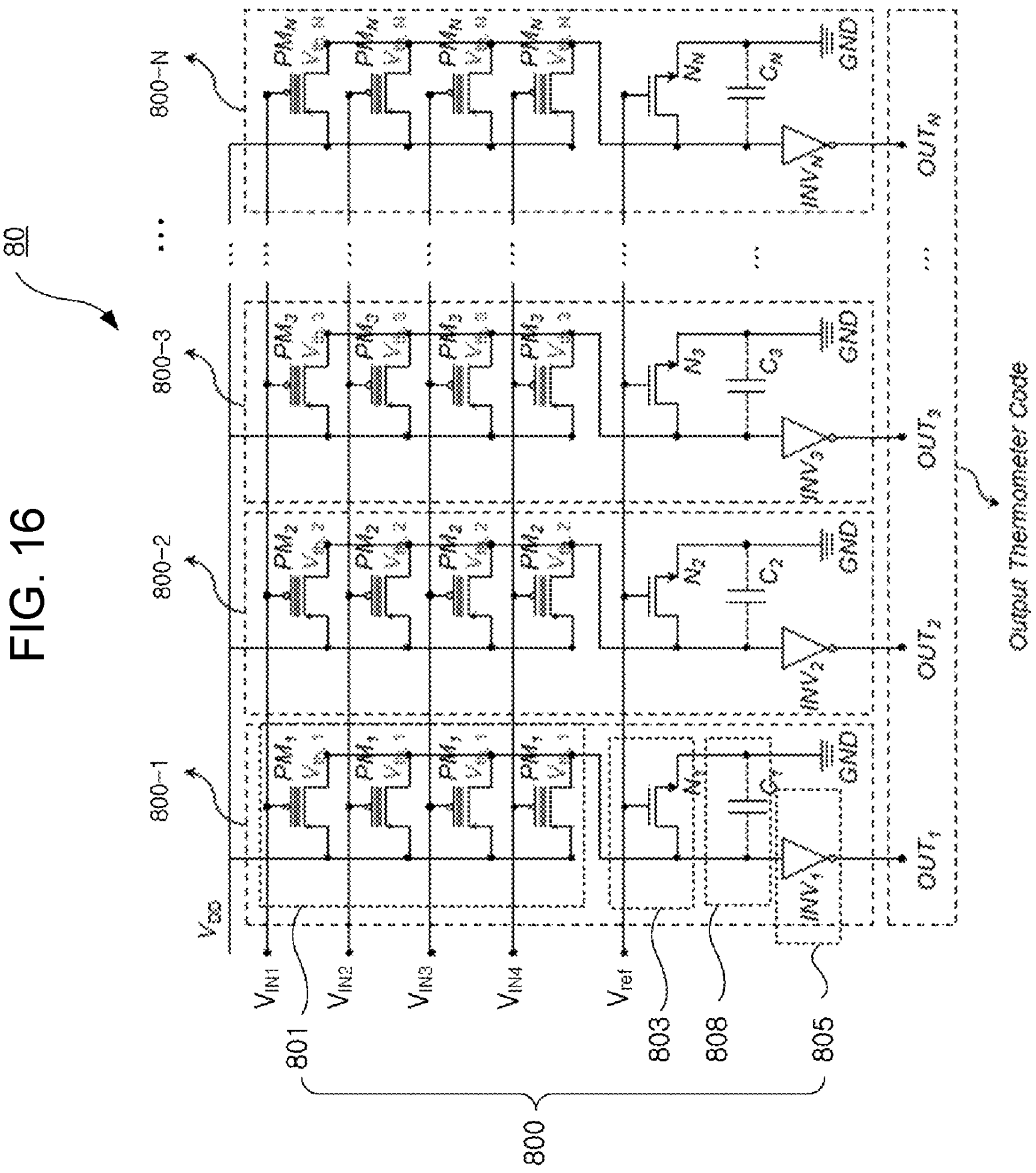
FIG. 16 is a circuit diagram illustrating the structure of the ADC according to the eighth embodiment of the present invention.

Hereinafter, with reference to the accompanying drawings, the structure and operation of the analog-to-digital converter (ADC) according to the eighth embodiment of the present invention will be described in detail. FIG. 16 is a circuit diagram illustrating the structure of the ADC according to the eighth embodiment of the present invention. Referring to FIG. 16, the ADC 80 according to the eighth embodiment includes a plurality of bit detection units 800 (800-1, 800-2, 800-3, . . . , 800-N) sequentially arranged, and these bit detection units are configured to match one-to-one with the bits constituting the digital code. Each of the bit detection units may be designed to detect and output the binary value corresponding to the matched bit of the digital code from multiple input signals ($V_{IN1}$, $V_{IN2}$, $V_{IN3}$, $V_{IN4}$.

The bit detection unit outputs a binary value to the output module, determined by the threshold voltage of the state level determination modules and the input signal, by utilizing the discharge and charge of the input capacitance of the output module. In particular, during the ADC operation, the bit detection unit in this embodiment initially discharges the input capacitance of the output module and then charges the input capacitance of the output module by applying the input voltage. Using this operation, the bit detection unit in this embodiment converts the input signal into the digital code.

The ADC according to this embodiment, similar to the ADC in the seventh embodiment, may be designed such that each bit detection unit detects a binary value corresponding to the matched bit of the digital code from multiple input signals. To achieve this, the state level determination modules in the bit detection units may be designed to have threshold voltage ($V_{th1}$, $V_{th2}$, . . . , $V_{thN}$) or conductance corresponding to the matched bits of the digital code. Additionally, the multiple state level determination modules constituting a single bit detection unit may be designed to have identical threshold voltage or conductance.

When multiple input signals are applied to the state level determination modules constituting the ADC, the charging or discharging speeds of the charges in the input capacitances of the output modules connected to the bit lines of the state level determination modules may be varied depending on the state of the state level determination modules in bit detection units. As a result, at the measurement point, the voltage levels of the bit lines of the state level determination modules in bit detection units can be read and output, thereby obtaining a digital code consisting of N bits.

Each of the bit detection units 800 comprises multiple state level determination modules 801 (PM1, PM2, PM3, . . . , PMN), a switching module 803 (N1, N2, N3, . . . , NN), and an output module 805 (INV1, INV2, INV3, . . . , INVN). The state level determination modules of the bit detection unit have threshold voltage or conductance set according to the matched bit of the digital code. In addition, the bit detection unit 800 may further comprise a capacitor 808 (C1, C2, . . . , CN) for adjusting the operation speed. The state level determination module, the switching module, the output module, and the capacitor for adjusting the operation speed according to the present embodiment may be configured the same as those of the seventh embodiment.

During the initial stage of the ADC operation, in order to initially discharge the input capacitance of the output module and set the output value of the output module to "1", the multiple state level determination modules according to the eighth embodiment may be composed of P-type memory devices, while the switching modules may be composed of N-type memory devices, which are of the opposite type to the state level determination modules.

The ADC according to this embodiment, as shown in FIG. 16, can perform pooling operations by simultaneously applying multiple different input signals to multiple input terminals, similar to the ADC in the seventh embodiment.

Ninth Embodiment

Figure 17:
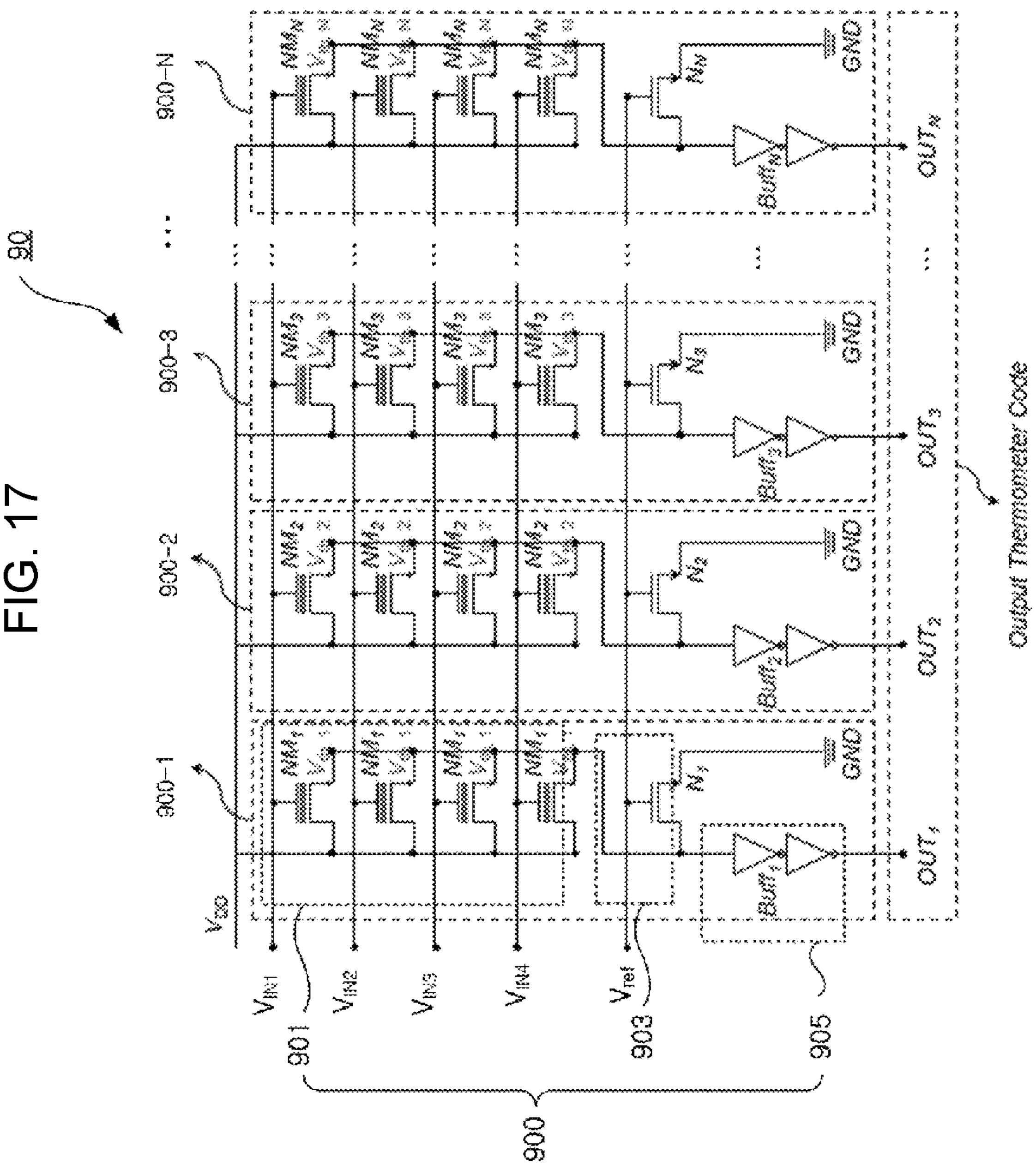
FIG. 17 is a circuit diagram illustrating the structure of the ADC according to the ninth embodiment of the present invention.

Hereinafter, the structure and operation of the analog-to-digital converter (ADC) according to the ninth embodiment of the present invention will be described in detail with reference to the attached drawings. FIG. 17 is a circuit diagram illustrating the structure of the ADC according to the ninth embodiment of the present invention. Referring to FIG. 17, the ADC 90 according to the ninth embodiment of the present invention has a plurality of bit detection units 900 (900-1, 900-2, 900-3, . . . , 900-N) sequentially arranged, and these bit detection units may be configured to match one-to-one with bits constituting the digital code. The bit detection units may be configured to detect and output binary values corresponding to the matched bits of the digital code, respectively, from the multiple input signals ($V_{IN1}$, $V_{IN2}$, $V_{IN3}$, $V_{IN4}$).

Each of the bit detection units includes multiple state level determination modules 901 connected in parallel with each other, a reference current source 903, and an output module 905. The multiple state level determination modules of the bit detection unit have threshold voltage or conductance set according to matched bit of the digital code. The bit detection unit may be output a binary value determined by a difference (Gap) between an input voltage and the threshold voltage of the state level determination module to the output module.

The configuration and operation of the state level determination modules, reference current source, and output module in the bit detection units may be the same as those of the fifth embodiment, so redundant description will be omitted. In the bit detection unit of the ADC according to the present embodiment, the state level determination modules may be composed of N-type memory devices, and the reference current source may be composed of N-type devices.

Tenth Embodiment

Figure 18:
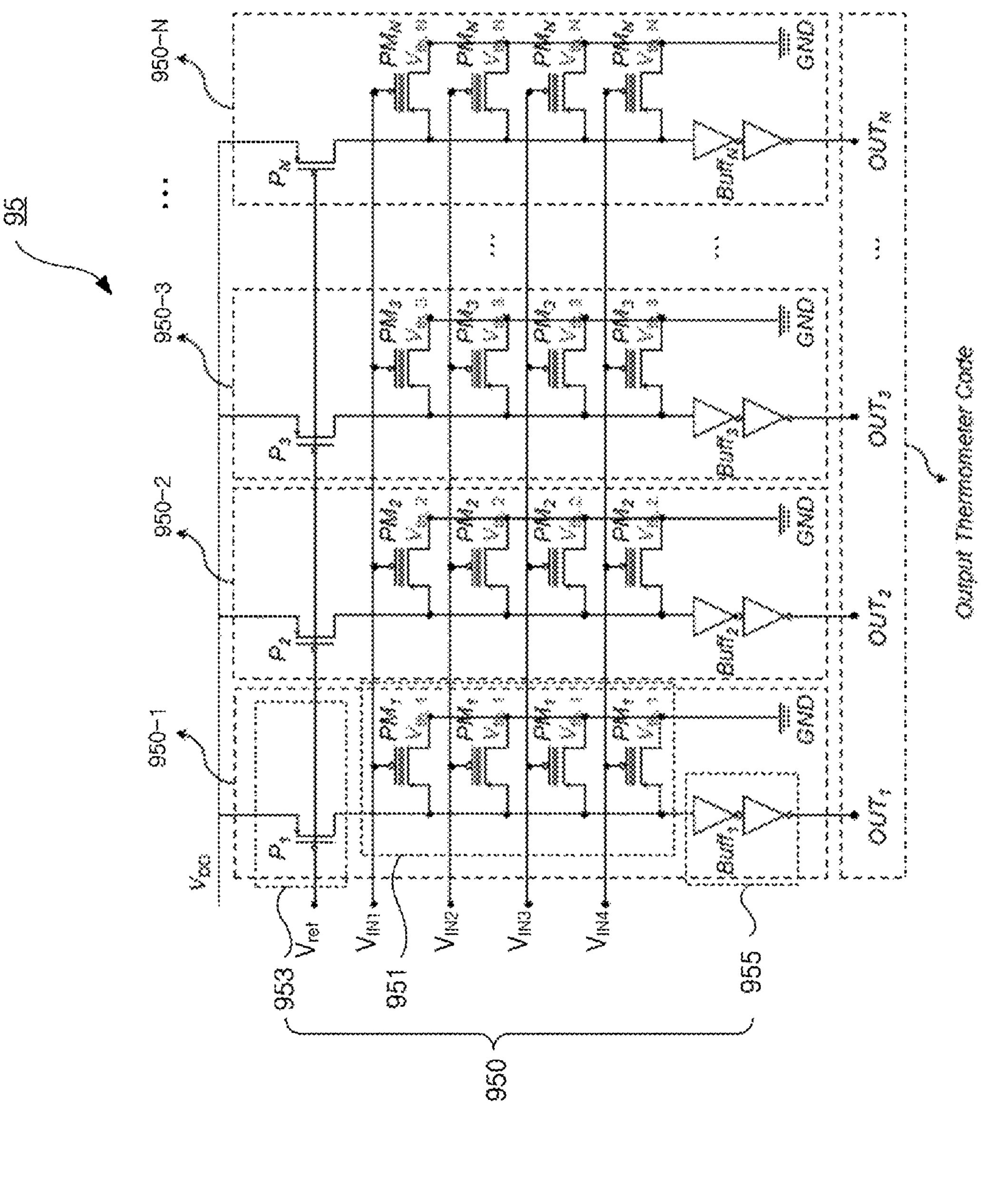
FIG. 18 is a circuit diagram illustrating the structure of the ADC according to the tenth embodiment of the present invention.

Hereinafter, the configuration and operation of the analog-to-digital converter according to the tenth embodiment of the present invention will be described in detail with reference to the attached drawings. FIG. 18 is a circuit diagram illustrating the structure of the ADC according to the tenth embodiment of the present invention. Referring to FIG. 18, the ADC 95 according to the tenth embodiment of the present invention has a plurality of bit detection units 950 (950-1, 950-2, 950-3, . . . , 950-N) sequentially arranged, and these bit detection units are configured to match one-to-one with bits constituting a digital code. The bit detection units may be configured to detect and output binary values corresponding to the matched bit of the digital code from the multiple input signals ($V_{IN1}$, $V_{IN2}$, $V_{IN3}$, $V_{IN4}$).

Each of the bit detection units may include multiple state level determination modules 951 connected in parallel with each other, a reference current source 953, and an output module 955. The state level determination modules in the bit detection unit may be designed to have threshold voltage or conductance set according to the matched bit of the digital code. Each bit detection unit may output a binary value to the output module, determined by the difference (Gap) between the input signal and the threshold voltage of the state level determination module.

The configuration and operation of the multiple state level determination modules, the reference current source, and the output module in the bit detection unit may be identical to those in the sixth embodiment, and thus redundant explanations will be omitted. In the bit detection units of the ADC according to this embodiment, the state level determination modules may be composed of P-type memory devices, and the reference current source may also be composed of P-type devices.

Hereinafter, a method for designing threshold voltages of state level determination modules of bit detection units in ADCs according to the first to tenth embodiments of the present invention described above will be described.

Figure 19:
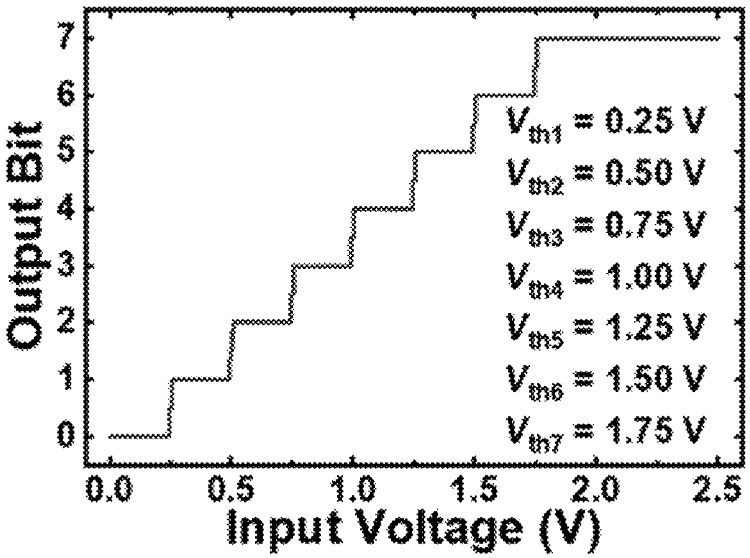
FIG. 19 is a graph exemplarily representing threshold voltages that implement linear output in the ADC according to the first embodiment of the present invention.

The ADCs according to the first to tenth embodiments of the present invention can generate various types of outputs depending on the method used to design the threshold voltages of the state level determination modules in the bit detection units. If the ADC is required a linear output corresponding to the magnitude of the input signal, the threshold voltages of adjacent state level determination modules can be designed to have a predetermined uniform difference (Gap). FIG. 19 is a graph exemplarily illustrating the threshold voltages used to achieve a linear output in the analog-to-digital converter according to the first embodiment of the present invention. Referring to FIG. 19, the threshold voltages ($V_{th1}$, $V_{th2}$, . . . , $V_{th7}$) of the state level determination modules may be set at regular intervals. As a result, the output bits may be linearly proportional to the input signal.

Figure 20:
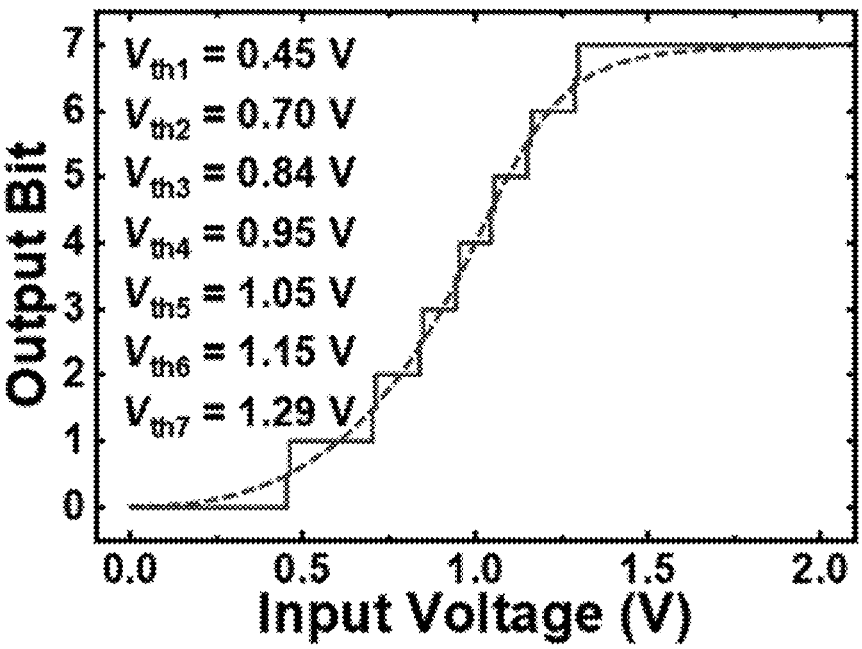
FIG. 20 is a graph exemplarily representing threshold voltages that implement nonlinear output in the ADC according to the first embodiment of the present invention.

On the other hand, if the ADC is required a nonlinear output corresponding to the magnitude of the input signal, the difference (Gap) between the threshold voltages of adjacent state level determination modules can be designed differently for each stage. FIG. 20 is a graph exemplarily illustrating threshold voltages used to achieve a nonlinear output in the analog-to-digital converter according to the first embodiment of the present invention. Referring to FIG. 20, the threshold voltages ($V_{th1}$, $V_{th2}$, . . . , $V_{th7}$) of the state level determination modules can be set to be spaced apart exponentially. As a result, the output bits may be output nonlinearly in proportion to the input signal.

As described above, by designing the threshold voltages of the state level determination modules in the ADC in various ways, both linear and nonlinear outputs can be implemented in various ways. This enables the realization of various types of activation functions used in neural networks.

In the above, the present invention has been described with respect to the preferred embodiment thereof, but this is only an example and does not limit the present invention. It will be appreciated that various modifications and applications not exemplified above are possible within the scope of the present invention defined in the appended claims. In addition, the differences related to such modifications and applications should be construed as being included in the scope of the present invention defined in the appended claims.

What is claimed is:

1. An analog-to-digital converter for converting one or more input analog signals into a digital code consisting of N bits (where N is a natural number) with binary values, and outputting the digital code, comprising:

a plurality of bit detection units sequentially arranged with each other and configured to output binary values of a digital code corresponding to one or more input signals, wherein each of the bit detection units comprises:

one or more state level determination modules composed of semiconductor device with predetermined threshold voltage or conductance and configured to receive the one or more input signals; and an output module connected to the state level determination modules and configured to receive a voltage determined by the state level determination modules and output a binary value corresponding to the received voltage, wherein the bit detection units are configured to match one-to-one with the bits of the digital code, respectively, and wherein the state level determination module of the bit detection unit has threshold voltage or conductance determined according to the matched bit of the digital code.

2. The analog-to-digital converter according to claim 1, wherein the state level determination module of the bit detection unit comprises a semiconductor device having non-volatile memory characteristics capable of varying a threshold voltage or conductance.

3. The analog-to-digital converter according to claim 1, wherein each of the bit detection units further comprises a threshold voltage adjustment module configured to adjust the threshold voltage or conductance of the state level determination module.

4. The analog-to-digital converter according to claim 1, wherein the state level determination module of the bit detection unit comprises one of a flash memory device, a resistive random-access memory (ReRAM) device, a phase-change memory (PCM) device, a ferroelectric memory device, a magnetic random access memory (MRAM) device, and a field-effect transistor (FET) device.

5. The analog-to-digital converter according to claim 1, wherein the state level determination module of the bit detection unit comprises a flash memory device or a field-effect transistor (FET) device with a gate electrode, and the device is configured to have a predetermined threshold voltage or conductance by adjusting a coupling ratio between the gate electrode and peripheral electrodes.

6. The analog-to-digital converter according to claim 1, wherein the output module of the bit detection unit is configured to generate and output a binary value corresponding to the input voltage of the output module based on a predetermined switching voltage, and comprises one of an inverter circuit, a buffer circuit, a sense amplifier, and a flip-flop circuit.

7. The analog-to-digital converter according to claim 1, wherein the output module is configured to determine an amount of charge accumulated in an input capacitance of the output module according to the state of the state level determination module, determine an input voltage of the output module according to the amount of charge, and detect and output a binary value corresponding to the input voltage of the output module.

8. The analog-to-digital converter according to claim 7, wherein the bit detection unit further comprises a switching module being connected to the state level determination module, and the switching module is configured to control the current flow through the state level determination module so as to charge or discharge the input capacitance of the output module connected to the state level determination module.

9. The analog-to-digital converter according to claim 7, wherein the bit detection unit further comprises an operation speed adjustment capacitor disposed between the input terminal and the ground terminal of the output module, and the operation speed adjustment capacitor is configured to increase the input capacitance of the output module, thereby adjusting the charging or discharging speed of the input capacitance and controlling the operation speed of the bit detection unit.

10. The analog-to-digital converter according to claim 1, wherein the output module is configured to determine the input voltage of the output module based on the difference between the threshold voltage of the state level determination module and the input signal applied to the state level determination module, and detect and output a binary value corresponding to the input voltage of the output module.

11. The analog-to-digital converter according to claim 10, wherein the bit detection unit further comprises a reference current source connected to the state level determination module and configured to provide a reference current to the state level determination module, and the reference current is a reference current for comparison when the state level determination module is turned on.

12. The analog-to-digital converter according to claim 11, wherein the reference current source of the bit detection unit is composed of a flash memory device or a field-effect transistor (FET) device, the bit detection units are each configured to have different reference current values, and the flash memory device or FET device constituting the reference current source is configured to have the channel width determined according to the reference current value.

13. The analog-to-digital converter according to claim 1, wherein two or more state level determination modules provided in a single bit detection unit are connected in parallel with each other.

14. The analog-to-digital converter according to claim 13, wherein two or more state level determination modules provided in a single bit detection unit have the same threshold voltage or conductance and are configured to receive respective input signals, the state level determination modules provided in different bit detection units have different threshold voltages or conductances, and the plurality of bit detection units output binary values constituting a digital code.

15. The analog-to-digital converter according to claim 1, wherein a single bit detection unit comprises multiple state level determination modules, and the multiple state level determination modules within the single bit detection unit are configured to have the same threshold voltage by being fabricated with a size larger than the process minimum size or by applying a common centroid layout technique such that the multiple state level determination modules share a single center, thereby reducing dispersion caused by the positions of the state level determination modules.

16. The analog-to-digital converter according to claim 1, further comprising a signal input unit configured to provide one or more input signals to one or more state level determination modules of the bit detection units, respectively, wherein the signal input unit sequentially provides the input signals to the one or more state level determination modules of the bit detection units, and the analog-to-digital converter sequentially outputs digital codes corresponding to the one or more input signals.

17. The analog-to-digital converter according to claim 1, further comprising a signal input unit which provides one or more input signals to one or more state level determination modules of the bit detection units, respectively;

wherein the signal input unit simultaneously provides the input signals to the state level determination modules of the bit detection units, respectively, and the analog-to-digital converter outputs a digital code corresponding to a value obtained by pooling the input signals.

* * * * *